United States Patent
Sekine et al.

(10) Patent No.: US 8,415,784 B2
(45) Date of Patent: Apr. 9, 2013

(54) ELECTRONIC DEVICE, CONDUCTIVE COMPOSITION, METAL FILLING APPARATUS, AND ELECTRONIC DEVICE MANUFACTURING METHOD

(75) Inventors: Shigenobu Sekine, Katsushika-ku (JP);
Yurina Sekine, Katsushika-ku (JP);
Yoshiharu Kuwana, Katsushika-ku (JP);
Ryuji Kimura, Katsushika-ku (JP)

(73) Assignee: Napra Co., Ltd., Tokyo (JP)

( * ) Notice: Subject to any disclaimer, the term of this patent is extended or adjusted under 35 U.S.C. 154(b) by 277 days.

(21) Appl. No.: 12/789,590

(22) Filed: May 28, 2010

(65) Prior Publication Data

US 2010/0301485 A1  Dec. 2, 2010

(30) Foreign Application Priority Data

Jun. 2, 2009 (JP) .................. 2009-133363
Jul. 15, 2009 (JP) .................. 2009-166426
Nov. 30, 2009 (JP) .................. 2009-272093
Jan. 13, 2010 (JP) .................. 2010-004907
Mar. 3, 2010 (JP) .................. 2010-046917

(51) Int. Cl.
*H01L 23/52* (2006.01)
*H01L 21/768* (2006.01)
*H01L 23/48* (2006.01)

(52) U.S. Cl. .................. 257/686; 257/774; 257/777

(58) Field of Classification Search .......... 257/685–700, 257/774, 777–778, E23.085
See application file for complete search history.

(56) References Cited

U.S. PATENT DOCUMENTS

| 7,402,903 B2 * | 7/2008 | Matsuo ................. 257/698 |
| 2004/0140521 A1 | 7/2004 | Okumura et al. |
| 2005/0230667 A1 | 10/2005 | Komagata et al. |
| 2008/0237781 A1 | 10/2008 | Uchiyama |
| 2009/0075478 A1 | 3/2009 | Matsui |
| 2009/0084588 A1 | 4/2009 | Sekine et al. |
| 2009/0189256 A1 | 7/2009 | Yoshimura et al. |

FOREIGN PATENT DOCUMENTS

| JP | 55-6805 | 1/1980 |
| JP | 55-43847 | 3/1980 |
| JP | 63-149066 | 6/1988 |
| JP | 11-274107 | 10/1999 |
| JP | 2002-158191 | 5/2002 |
| JP | 2002-237468 | 8/2002 |
| JP | 2002-368082 | 12/2002 |
| JP | 2003-40647 | 2/2003 |
| JP | 2003-139172 | 5/2003 |
| JP | 2004-31923 | 1/2004 |
| JP | 2004-200584 | 7/2004 |
| JP | 2005-116863 | 4/2005 |

(Continued)

OTHER PUBLICATIONS

Office Action issued on Jan. 5, 2011, in Japanese Patent Application No. 2010-046917 (with English Translation).

*Primary Examiner* — Cuong Q Nguyen
(74) *Attorney, Agent, or Firm* — Oblon, Spivak, McClelland, Maier & Neustadt, L.L.P.

(57) ABSTRACT

An electronic device includes a plurality of stacked substrates. Each of the substrates includes a semiconductor substrate, a columnar conductor, and a ring-shaped insulator. The columnar conductor extends along a thickness direction of the semiconductor substrate. The ring-shaped insulator includes an inorganic insulating layer mainly composed of a glass. The inorganic insulating layer fills a ring-shaped groove that is provided in the semiconductor substrate to surround the columnar conductor.

23 Claims, 28 Drawing Sheets

FOREIGN PATENT DOCUMENTS

| | | |
|---|---|---|
| JP | 2005-236054 | 9/2005 |
| JP | 2005-303258 | 10/2005 |
| JP | 2005-322805 | 11/2005 |
| JP | 2006-165025 | 6/2006 |
| JP | 2006-203170 | 8/2006 |
| JP | 2008-063449 | 3/2008 |
| JP | 2008-251964 | 10/2008 |
| JP | 4278007 | 3/2009 |
| JP | 2009-181981 | 8/2009 |
| JP | 2009-277927 | 11/2009 |
| JP | 2009-295719 | 12/2009 |
| WO | 2004-022663 | 3/2004 |

\* cited by examiner

ELECTRONIC DEVICE, CONDUCTIVE COMPOSITION, METAL FILLING APPARATUS, AND ELECTRONIC DEVICE MANUFACTURING METHOD

CROSS-REFERENCE TO RELATED APPLICATIONS

This application claims the benefit of priority under 35 U.S.C. §119 from Japanese patent Application Nos. 2010-046917, filed Mar. 3, 2010, 2010-004907, filed Jan. 13, 2010, 2009-272093, filed Nov. 30, 2009, 2009-166426, filed Jul. 15, 2009, and 2009-133363, filed Jun. 2, 2009, the entire content of each of which is incorporated herein by reference.

BACKGROUND OF THE INVENTION

1. Field of the Invention

The present invention relates to an electronic device, a conductive composition, a metal filling apparatus, and an electronic device manufacturing method.

2. Description of the Related Art

In the field of electronic devices such as integrated circuits, semiconductor devices and chips thereof, there has been adopted a method of two-dimensionally arranging semiconductor chips on a circuit board and connecting them by wiring. In this method, however, as the mounting area increases with the number of semiconductor chips, the wiring length also increases, which makes it difficult to achieve compactification, higher performance, and low power consumption of electronic devices. In the present situation where the microfabrication technology has been pursued to the utmost, achieving the compactification, higher performance, and low power consumption through the microfabrication or miniaturization of semiconductor chips cannot be expected anymore.

Therefore, there has been developed a TSV (through-silicon-via) technology where stacked circuit boards are connected together with through-electrodes.

The TSV technology realizes a three-dimensional structure electronic device such as a three-dimensional system-in-package (3D-SiP). This enables incorporation of many functions into a small occupation area and dramatic shortening of important electrical pathways between devices, which results in high-speed processing.

However, the TSV technology has the following several problems.

(1) Insulation Between Through-Electrode and Silicon Substrate

As means for electrically insulating a through-electrode from a silicon substrate, Japanese Unexamined Patent Application Publication No. 2008-251964 discloses a technology in which a ring-shaped isolation groove passing through a silicon substrate is formed around a through-electrode passing through the silicon substrate, silicon films are directly formed on bottom and side faces of the isolation groove, and an insulating film is then formed on the silicon films to fill the gap left within the isolation groove, wherein the silicon film whose surface is in contact with an inner or outer peripheral side face of the isolation groove is thermally oxidized into a thermally-oxidized silicon film.

However, even if the through-electrode is electrically insulated from the silicon substrate, reactance may decrease with increase in stray capacitance, particularly in a GHz scale high-frequency area, according to the electrical insulating structure. Thus, a high-frequency signal leaks from the through-electrode to the silicon substrate, deteriorating signal transmission characteristics. In order to improve the signal transmission characteristics in a GHz scale high-frequency area, accordingly, it is necessary to make a further improvement such as increasing the specific resistance as high as possible while decreasing the relative permittivity at the insulating portion where the through-electrode is electrically insulated from the silicon substrate.

If the disclosure of Japanese Unexamined Patent Application Publication No. 2008-251964 is viewed from this point, since the structure is such that the through-electrode is electrically insulated from the silicon substrate by the thermally-oxidized silicon film, the signal transmission characteristics cannot be improved beyond a level that is achieved by the electrical insulation of the thermally-oxidized silicon film. That is, the improvement of the signal transmission characteristics is limited.

Moreover, since it is necessary to have the step of forming the silicon films directly on the bottom and side faces of the isolation groove, the step of forming the insulating film on the silicon films to fill the gap left within the isolation groove after formation of the silicon films, and also the step of thermally oxidizing the surface of the silicon film, the process inevitably becomes complicated and troublesome. When replacing the conventional two-dimensional arrangement technology with the TSV technology, what is important in terms of industrial mass production is the cost/performance, but the above technology cannot sufficiently meet this requirement.

In the above technology, furthermore, since the film is used to fill up the isolation groove, the groove width of the isolation groove has to be set at an extremely small value, for example, about 2 μm, so that considering the typical thickness of a wafer, the aspect ratio of the isolation groove would be as much as 100 to 200. This makes difficult the silicon film formation process for the isolation groove.

(2) Thermal Deterioration of Through-Electrode During Formation and Joining

When forming the through-electrode in a semiconductor chip or wafer, in which a circuit element has been already formed, using the above molten metal filling process or a plating process (via last), it is necessary to avoid thermal deterioration of the circuit element due to heat for melting.

From the viewpoint of avoiding the deterioration of the circuit element due to heat for melting, it is desirable to use a metal material of a low melting point, which however results in deteriorating heat resistance of an electronic device.

For example, tin and indium, which are taken as an example of a metal material for forming the through-electrode in Japanese Unexamined Patent Application Publication No. 2002-158191, have an advantage that deterioration of the semiconductor circuit element due to heat for melting at the time of formation of the through-electrode can be avoided because of the low melting point, but the low melting point impairs thermal reliability.

In order to realize a three-dimensional structure electronic device using the TSV technology, moreover, two or more wafers or chips formed with the through-electrodes have to be sequentially joined together with the through-electrodes brought into alignment. As a junction material, a metal junction material may be chosen from the viewpoint of improving electrical characteristics and joining ability for the through-electrodes. The circuit board can be joined together by melting and then solidifying the metal junction material.

Also in this case, there is a problem that the previously formed circuit element may be thermally damaged during the melting and joining process of the metal junction material.

The same problem also occurs when forming wiring planar conductor patterns on the surface of the wafer along with or independently of the through-electrodes.

(3) Occurrence of Cracks or the Like at Through-Electrode and its Surrounding Area As a common problem among molten metal filling processes, there has been observed a phenomenon that the through-electrode is cracked, the insulating film disposed between the inner wall surface of the through-hole and the peripheral surface of the through-electrode is partially broken by the through-electrode, or eventually the silicon substrate is cracked around the through-electrode.

This problem is not limited to the formation of the through-electrode. Also when stacking a number of circuit boards in order to realize the above three-dimensional arrangement, the same problem may occur at terminals for connection between the circuit boards.

(4) Poor Connection Between Through-Electrode and Conductor Pattern

From a functional perspective, the through-electrode has to be connected, at least at one end, to a conductor pattern formed on the substrate. However, if the surface of the conductor pattern is oxidized, poor connection may occur between the through-electrode and the conductor pattern.

As general means for solving this problem, the reduction effect of a flux may be used for reducing the oxide film of the conductor pattern.

However, putting the flux into a minute space along with the molten metal material generates a flux gas. In electronic devices of this type, the minute space is a minute hole having a hole diameter of, for example, tens of μm or less and also a considerably high aspect ratio. If the flux gas is generated within the thus-shaped minute space, of course, the gas cannot easily escape, creating voids due to the flux gas around the through-electrode, which results in reduction of sectional area of the columnar conductor, increase of electrical resistance, and eventually poor connection to the conductor pattern and increase of junction resistance.

This problem is not limited to the formation of the vertical electrode. Also when stacking a number of circuit boards in order to realize the three-dimensional arrangement, it may result in poor connection at terminals for connection between the circuit boards, increase of electrical resistance, and increase of junction resistance.

(5) Difficulty of Molten Metal Filling into Minute Space

When forming the through-electrode, it is extremely difficult to sufficiently fill a high-aspect ratio minute space with a filling material down to the bottom thereof without causing voids or deformation after hardening.

Wafers to be used for manufacturing a semiconductor device are provided with a large number of minute spaces (holes) for formation of electrodes or the like, and the minute spaces are extremely small, for example, with a hole diameter of tens of it μm or less. In addition, the thickness of the wafer is considerably large as compared with the minute space having such a small hole diameter, so that the minute space quite often has an aspect ratio of 5 or more. In order to form the through-electrode, a conductive material has to be reliably filled into such a small, high-aspect ratio minute space down to the bottom thereof, which of course requires an advanced filling technology.

As the electrode formation technology, although the technology of using a conductive past that is a mixture of a conductive metal component and an organic binder has been known, attention is now being given to a metallurgical technology using a molten metal material that has superior electrical conductivity, low loss, and excellent high-frequency characteristics. For example, such a technology is disclosed in Japanese Unexamined Patent Application Publication No. 2002-237468 (hereinbelow referred to as Document 1), Japanese Unexamined Patent Application Publication No. 2006-203170 (hereinbelow referred to as Document 2), and Japanese Unexamined Patent Application Publication No. 2002-368082 (hereinbelow referred to as Document 3).

In Documents 1 and 2, at first, disclosed is a technology of filling a metal into a minute space (through-hole) by means of a metal filling apparatus adopting a molten metal refilling process. The molten metal refilling process refers to a process of reducing the pressure of an atmosphere in which a target (wafer) is placed, then inserting the target into a molten metal while keeping the reduced pressure, then increasing the atmospheric gas pressure around the molten metal so that the molten metal can be filled into the space with the difference in atmospheric gas pressure between before and after the insertion into the metal, and then pulling the target out of the molten metal bath for cooling in the air.

In the metal filling apparatus, two rooms, each of which is provided with a pressure increasing/reducing means, are vertically arranged within a chamber and separated from each other by a switching valve. Then, the wafer being a target is held in a suspended state by a carrier jig, dipped into a molten metal bath placed in the lower room, and then moved to and cooled in the upper room for hardening the molten metal within the minute space.

With the metal filling apparatus, however, when the target is pulled out of the molten metal bath, the molten metal within the minute space may be drawn out by the molten metal in the bath or allowed to drip from or bead within the space under the influence of surface tension of the molten metal and the like.

Accordingly, when the target is pulled out of the molten metal bath and then cooled, the surface of the metal within the minute space may be recessed to a level lower than the surface of the target. This may cause defective electrical continuity to the outside.

In order to avoid this, the molten metal has to be supplied again for filling the recess. In order to fill the recess, moreover, the surface of the supplied metal has to be set higher than the surface of the target, which requires a process of matching the surface of the metal with the surface of the target, for example, a CMP (chemical mechanical polishing) process. This may result in complicating the process and causing an ensuing decrease in yield.

A further serious problem is that although the complicated process is required as described above, voids due to insufficient filling of the molten metal may be created in the minute space, particularly at the bottom thereof.

Furthermore, because of its complicated structure, this apparatus is difficult to maintain and unfavorable in view of cost.

On the other hand, Document 3 discloses a metal filling apparatus adopting a differential pressure filling process. In the differential pressure filling process, after a target (sample) formed with a minute space and a metal sheet attached to the target are placed in a vacuum chamber, the pressure of the vacuum chamber is reduced, the metal sheet is melted by heating means, and then the pressure of the vacuum chamber is increased to a level higher than the atmospheric pressure by an inactive gas. With this, the molten metal can be vacuum sucked into the minute space. Subsequently, the vacuum chamber is opened, the molten metal left on the sample surface is removed, and then it is cooled in the air at room temperature.

Document 3 claims that it has an advantage that the sample will never be warped or cracked because its molten metal has a lower heat capacity as compared with the molten metal refilling process (Document 1) and that cost reduction can be achieved because the excess metal can be minimized.

With the differential pressure filling process described in Document 3, however, the molten metal cannot be completely filled into the minute space down to the bottom thereof, which creates voids within.

In addition, since the molten metal left on the sample surface has to be removed, a part (upper end) of the molten metal filled into the minute space may also be scraped off during the process. Accordingly, the problem of the recessed surface remains unsolved.

Moreover, this apparatus is also unfavorable in view of cost and processing efficiency because it takes long time to prepare a metal sheet previously shaped in conformity with the shape of the target and to attach the metal sheet onto the target through a solder ball or the like.

In fact, any wafers manufactured by the differential pressure filling process and devices using the same have not yet been supplied to the market, which proves that the above problem remains unsolved.

SUMMARY OF THE INVENTION

It is an object of the present invention to provide an electronic device, a conductive composition, a metal filling apparatus, and an electronic device manufacturing method, which are capable of solving at least one of the several problems concerning the TSV technology.
1. Electronic Device An electronic device according to the present invention is formed by stacking a plurality of substrates. Each of the substrates includes a semiconductor substrate, a columnar conductor (or vertical conductor), and a ring-shaped insulator. The columnar conductor extends along a thickness direction of the semiconductor substrate. The ring-shaped insulator includes an inorganic insulating layer, and the inorganic insulating layer fills a ring-shaped groove that is provided in the semiconductor substrate to surround the columnar conductor.

In each of the stacked substrates of the electronic device according to the present invention, as described above, since the ring-shaped insulator is formed within the ring-shaped groove that is provided in the semiconductor substrate to surround the columnar conductor, the columnar conductor, for example, such as a through-electrode can be electrically insulated by the ring-shaped insulator from other adjacent columnar conductors.

In addition, the ring-shaped insulator contains an inorganic insulating layer. The inorganic insulating layer is mainly composed of a glass and fills the ring-shaped groove. For the glass component, a material having a low relative permittivity and a high specific resistance may be selected for use among various glass materials. Therefore, the relative permittivity and specific resistance of the ring-shaped insulator as a whole can be adjusted by the selection of the glass material, thereby reducing signal leakage in a high-frequency area and improving signal transmission characteristics. Moreover, a dense insulating structure can be realized without any voids because of its filled structure.

Furthermore, since the inorganic insulating layer is a filled layer, there is no reason to decrease the groove width of the ring-shaped groove unlike the prior art which requires a deposition process. This simplifies the formation process of the inorganic insulating layer and, eventually, the formation process of the ring-shaped insulator.

The inorganic insulating layer can be formed by filling a liquid glass, i.e., a glass paste into the ring-shaped groove and then hardening it. Thus, a low-cost electronic device substrate can be realized using such a simple and inexpensive process of filling a liquid glass into a ring-shaped groove.

In addition to the glass component, the inorganic insulating layer may contain a ceramic component being a sintered compact or particle. The relative permittivity and specific resistance of the ring-shaped insulator as a whole can also be adjusted by selecting the relative permittivity and specific resistance for the ceramic component to be contained. This reduces signal leakage in a high-frequency area and improves signal transmission characteristics.

The ring-shaped insulator may have insulating layers on inner wall surfaces of the ring-shaped groove. This insulating layer preferably includes an oxide layer, more preferably a nitride layer. The oxide layer and the nitride layer may be a single layer or multiple layers. In addition, the oxide layer and the nitride layer may be a layer deposited on an inner surface of the ring-shaped groove or a layer obtained by oxidizing or nitriding the surface of the semiconductor substrate which appears on the inner surfaces of the ring-shaped groove. This insulating structure makes it possible to avoid a negative effect of the ring-shaped insulator, particularly a negative effect of the glass component contained in the inorganic insulating layer, on the semiconductor substrate.

In the electronic device according to the present invention, as described above, between adjacent ones of the plurality of stacked substrates, connection conductors are joined to each other through a junction film. The junction film preferably contains a first metal or alloy component and a second metal or alloy component having a higher melting point than the first metal or alloy component, whereby a melting temperature is made higher than the melting point of the first metal or alloy component.

Since the junction film for joining the connection conductor of one of adjacent substrates to the connection conductor of the other substrate contains the first metal or alloy component and the second metal or alloy component, as described above, the small size effect occurs at the time of joining because of the small film thickness of the junction film, allowing the second metal or alloy component to melt at a temperature close to the melting point of the first metal or alloy component. At this time, since the first metal or a low melting point metal of the alloy component is consumed by reacting with the connection conductor and forming an intermetallic compound, the melting point increases considerably after joining.

In addition, since the first metal or alloy component reacts with the second metal or alloy component, the melting temperature of the junction film after solidification increases to a temperature close to the melting point of the second metal or alloy component, i.e., a temperature that is higher the melting point of the first metal or alloy component at the very least.

According to the present invention, therefore, it is possible to realize a highly heat-resisting electronic device which requires a low heat treatment temperature during the joining process but can secure a high melting point after solidification.
2. Conductive Composition In order to realize the electronic device according to the present invention, it is desirable that the columnar conductor and the junction film can be melted at a low temperature but have a higher melting point after melt-solidification. A conductive composition according to the present invention satisfies such characteristics and includes first metal particles and second metal particles. The first metal particles have an average particle size in such a nm range as to exhibit small size effect, enabling melting at a temperature lower than a melting point, and melting of the first metal particles causes melting of the second metal particles.

It is known that most metal particles can be melted at a temperature lower than the melting point by reducing their particle size. This is because the occupancy of surface atoms increases with reduction of the particle size. In this specification, the melting point reduction effect due to the refining is referred to as "small size effect".

In the present invention, since the first metal particles have an average particle size in such a nm range as to exhibit small size effect, the melting point reduction effect can be obtained because of the small size effect.

If the particle size (diameter) of the metal particle is reduced to a level as small as a de Broglie wavelength of atoms (several nm to 20 nm), electrons are confined within that area, which leads to discrete electronic density of states. Moreover, since freedom of movement of electrons is extremely limited, their kinetic energy increases. This phenomenon is called "quantum size effect" which is the ultimate level of the melting point reduction due to the small size effect, wherein the first metal particles can be melted at a temperature of, for example, 250° C. or less, preferably, 200° C. or less, more preferably, 180° C. or less.

The conductive composition according to the present invention includes not only the first metal particles but also the second metal particles. Melting of the second metal particles is caused by melting of the first metal particles. Specifically, the second metal particles may be made of a material having a melting point lower than a melting temperature of the first metal particles.

Therefore, columnar conductors and wiring conductor patterns can be formed without causing thermal deterioration of a previously formed semiconductor circuit element even if the columnar conductors and wiring conductor patterns are formed on a chip or wafer by melt-solidifying the conductive composition according to the present invention. In addition, heat resistance due to a high melting point of the first metal particles can be secured after solidification.

The conductive composition according to the present invention may be used for various electronic devices as a columnar conductor filling a vertical hole bored into a substrate along a thickness direction or an electrode material for forming wiring patterns on a substrate surface. When filling a vertical hole bored into a substrate along a thickness direction, it serves not only as the columnar conductor but also as a filling material.

When forming a three-dimensional system-in-package (3D-SiP), moreover, it can be used as a junction material for joining together stacked substrates. In any case, since its melting temperature is low but a high melting point can be secured after solidification, it is possible to realize a highly reliable electronic device.

3. Structure of Columnar Conductor

In the electronic device according to the present invention, the columnar conductor included in the substrate is closely related to performance and reliability of the electronic device. Therefore, it is intended to provide a high-performance and highly reliable columnar conductor. The columnar conductor is a metal or alloy melt-solidified product disposed in the substrate, has an equiaxed crystal area at least in an area opposed to the substrate, and contains bismuth (Bi) and gallium (Ga) as an inoculant within the melt-solidified product.

In the present invention, as described above, since the columnar conductor is a metal or alloy melt-solidified product and has an equiaxed crystal area at least in an area opposed to the substrate, there is obtained an isotropy due to the equiaxed crystal structure. This suppresses the occurrence of cracking of the columnar conductor, breaking of the insulating film, and cracking of the substrate.

In addition, since the bismuth (Bi) and gallium (Ga) contained in the melt-solidified product as an inoculant have a negative volume change, they can suppress columnar crystal growth effectively and are therefore suitable for nucleation of the above equiaxed crystal area.

At least in an area opposed to the substrate, moreover, the equiaxed crystal area preferably accounts for a larger area of the columnar conductor than the columnar crystal area. With this relationship, the isotropy of the equiaxed crystal becomes more predominant at least in the area opposed to the substrate, which suppresses more effectively the occurrence of cracking of the electrode, breaking of the insulating film, and cracking of the substrate.

One embodiment of the columnar conductor is a planar wiring which can be realized by forming, on one surface of the substrate, minute spaces within a mask frame or the like, filling a molten metal into the minute spaces, which serve as a mold, and then solidifying it.

If the columnar conductor is a through-conductor or a non-through-conductor, the substrate has a through-hole or non-through-hole, and the columnar conductor is joined to an inner surface of the hole with the equiaxed crystal area disposed at least in an area that is in contact with the inner surface of the hole. This columnar conductor can be realized by filling a molten metal into the hole of the substrate, which serves as a mold, and then solidifying it.

Another proposal concerning the columnar conductor is for the case where the substrate includes a first conductor, a columnar conductor, and a junction film. The first conductor is disposed on one side of the substrate and opposed to a bottom of a through-hole of the substrate. The columnar conductor contains a Sn alloy and fills the through-hole of the substrate with its bottom face opposed to the first conductor at the bottom of the through-hole.

The junction film is a metal other than noble metals and has a higher melting point than the Sn alloy. Moreover, the junction film is disposed between the bottom face of the columnar conductor and the first conductor inside the bottom of the through-hole and diffused into the columnar conductor to produce an alloy area, thereby joining the first conductor to the columnar conductor.

The above junction structure can be produced by a simple process of supplying a molten metal for forming the columnar conductor to a metal for forming the junction film and then cooling it. As compared with the case of a plating technology, therefore, the number of processing steps and the processing time can be decreased and shortened considerably. Accordingly, there can be realized a low-cost three-dimensional arrangement electronic device.

Moreover, the process of how the high melting point metal for forming the junction film is melted and diffused into the molten metal containing the Sn alloy to produce an alloy area can be described in accordance with a known phase diagram. According to the phase diagram, even if metal particles have a higher melting point than the Sn alloy, they can be melted at a temperature of 250° C. or less. Therefore, joining of the columnar conductor to the first conductor can be realized at a low temperature, avoiding thermal damage to a semiconductor circuit element which may be contained in a circuit board.

Furthermore, since the alloy area, which is produced by diffusion of the high melting point metal for forming the junction film into the columnar conductor containing the Sn alloy, has a higher melting point than at the time of thermal diffusion, there can be obtained a conductor joining structure excellent in thermal stability.

Since the high melting point metal for forming the junction film is reduced in the melting process, a reduction process with a flux is not necessary. Accordingly, the occurrence of voids due to the flux can be suppressed, which makes it possible to realize an electronic device which avoids reduction of sectional area of the columnar conductor, increase of electrical resistance, and eventually poor connection to the first conductor and increase of junction resistance.

4. Metal Filling Apparatus

In order realize the electronic device according to the present invention, the columnar conductor has to be formed. A metal filling apparatus according to the present invention is suitable for formation of such a columnar conductor. This metal filling apparatus is an apparatus for filling a molten metal into a minute space of a substrate (wafer) and includes a support, a molten metal supply unit, and a pressurizing means.

The support includes a processing chamber for processing the wafer, a first member with a mounting surface for mounting of the wafer, and a second member with a metal supply path leading to the processing chamber. The processing chamber is defined by combining the first member and the second member.

The molten metal supply unit is designed to fill the minute space of the wafer, which is mounted on the mounting surface, with the molten metal through the metal supply path. Then, the pressurizing means is designed to apply a pressure to the wafer and the molten metal filled into the minute space.

In the metal filling apparatus according to the present invention, as described above, since the processing chamber of the support has the mounting surface for mounting of the wafer and the molten metal supply unit is designed to fill the minute space of the wafer, which is mounted on the mounting surface, with the molten metal through the metal supply path, a process of pulling the wafer out of a molten metal bath is not necessary. Thus, there is no possibility of causing a problem that the molten metal within the minute space may be drawn out by the molten metal in the bath or allowed to drip from or bead within the space under the influence of surface tension of the molten metal and the like. Accordingly, the minute space can be filled with the metal material without creating any cavities or voids.

In addition, since the metal filling apparatus according to the present invention includes the pressurizing means and the pressurizing means is designed to apply a pressure to the wafer and the molten metal filled into the minute space, the molten metal can be sufficiently filled into the minute space down to the bottom thereof and deformation of the metal due to thermal contraction can be suppressed. Accordingly, the minute space can be filled with the metal without creating any cavities or voids.

In the case where the minute space is a through-hole, moreover, since the support supports the wafer from the side opposite from an opening of the minute space, which is exposed to the processing chamber, the other opening can be closed on the surface supporting the wafer. Therefore, the molten metal within the minute space can be sufficiently pushed into the minute space with the pressure being applied in one direction from the exposed opening, while the molten metal is prevented from leaking from the other closed opening.

Also in the case where the minute space is a non-through-hole, needless to say, the pressure can be similarly applied in one direction from the opening without causing leakage of the molten metal.

Accordingly, the metal filling apparatus according to the present invention can also prevents the molten metal from having a recessed surface which would otherwise be caused by cooling in the minute gap. This reliably secures electrical continuity to the outside.

Since the metal is prevented from having a recessed surface, moreover, resupply of a molten metal or a CMP process is not necessary after cooling, which contributes to simplification of the process and improved yield.

The above pressurizing means may be provided using at least one selected from a gas pressure, a pressing pressure, an injection pressure, a rolling pressure, a centrifugal force, and a magnetic force. When utilizing the gas pressure among them, a pressure control unit may be provided for controlling a pressure within the processing chamber, and this pressure control unit can double as the pressurizing means.

When utilizing the injection pressure, on the other hand, the pressurizing means and the molten metal supply unit may be provided by an injection machine. The injection machine may be adapted not only to supply the molten metal to the processing chamber by injection but also to continue giving its injection pressure to the processing chamber until the molten metal filled into the minute space is hardened by cooling. When utilizing the pressing pressure, on the other hand, a press may be employed as the pressurizing means.

At an early stage of the hardening step in the pressurizing operation, preferably, not only static pressure but also dynamic pressure is actively utilized to perform dynamic pushing by the dynamic pressure. With this method, creation of unfilled areas at the bottom can be avoided more reliably by making the molten metal certainly reach the bottom of the minute space.

More preferably, the molten metal supply unit supplies the molten metal such that a metal film is formed over the opening. With this, the molten metal can be certainly pushed into the minute space with a compelling external force received by the metal film.

In the case where the molten metal supply unit supplies the molten metal such that a metal film is formed over the opening, as described above, the metal filling apparatus is preferably provided with a means for remelting the metal film over the opening after hardening of the molten metal and wiping off the remelted metal film. Although heat for remelting is also conducted to the hardened metal within the minute space, since the hardened metal has a considerably higher heat capacity than the metal film, remelting of the metal film will never lead to remelting of the hardened metal. Thus, a flat surface without any recess can be formed by wiping off only the metal film. Alternatively, the metal film left over the opening may be mechanically removed without remelting.

It should be noted that in this specification, the term "metal" may sometimes be used as an idea including an alloy containing two or more metal elements, in addition to a metal of a single element.

The other objects, constructions and advantages of the present invention will be further detailed below with reference to the attached drawings. However, the attached drawings show only illustrative examples.

DESCRIPTION OF THE PREFERRED EMBODIMENTS

1. Electronic Device

Figure 1:
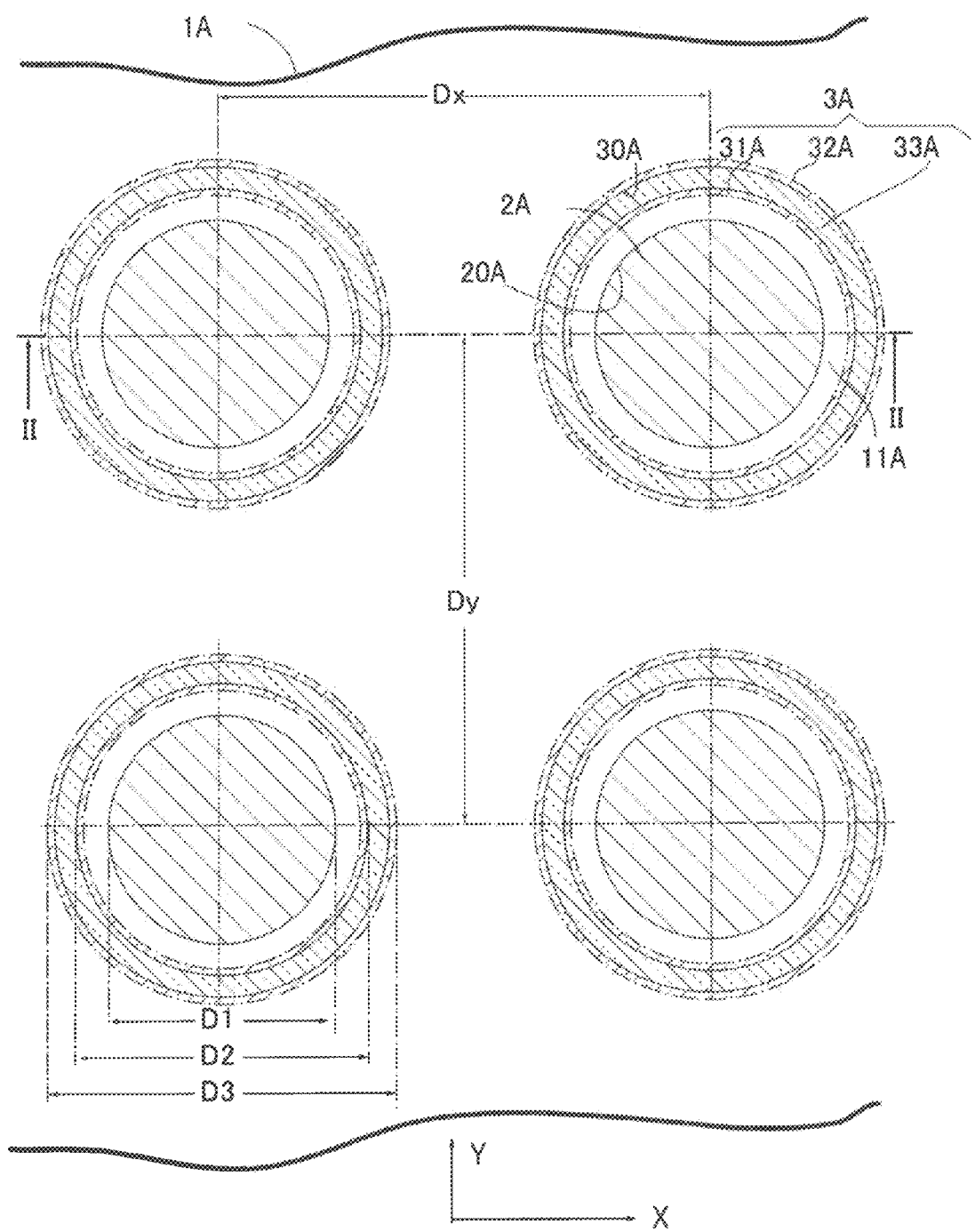
FIG. 1 is a plan view showing a portion of an electronic device according to the present invention.
Figure 2:
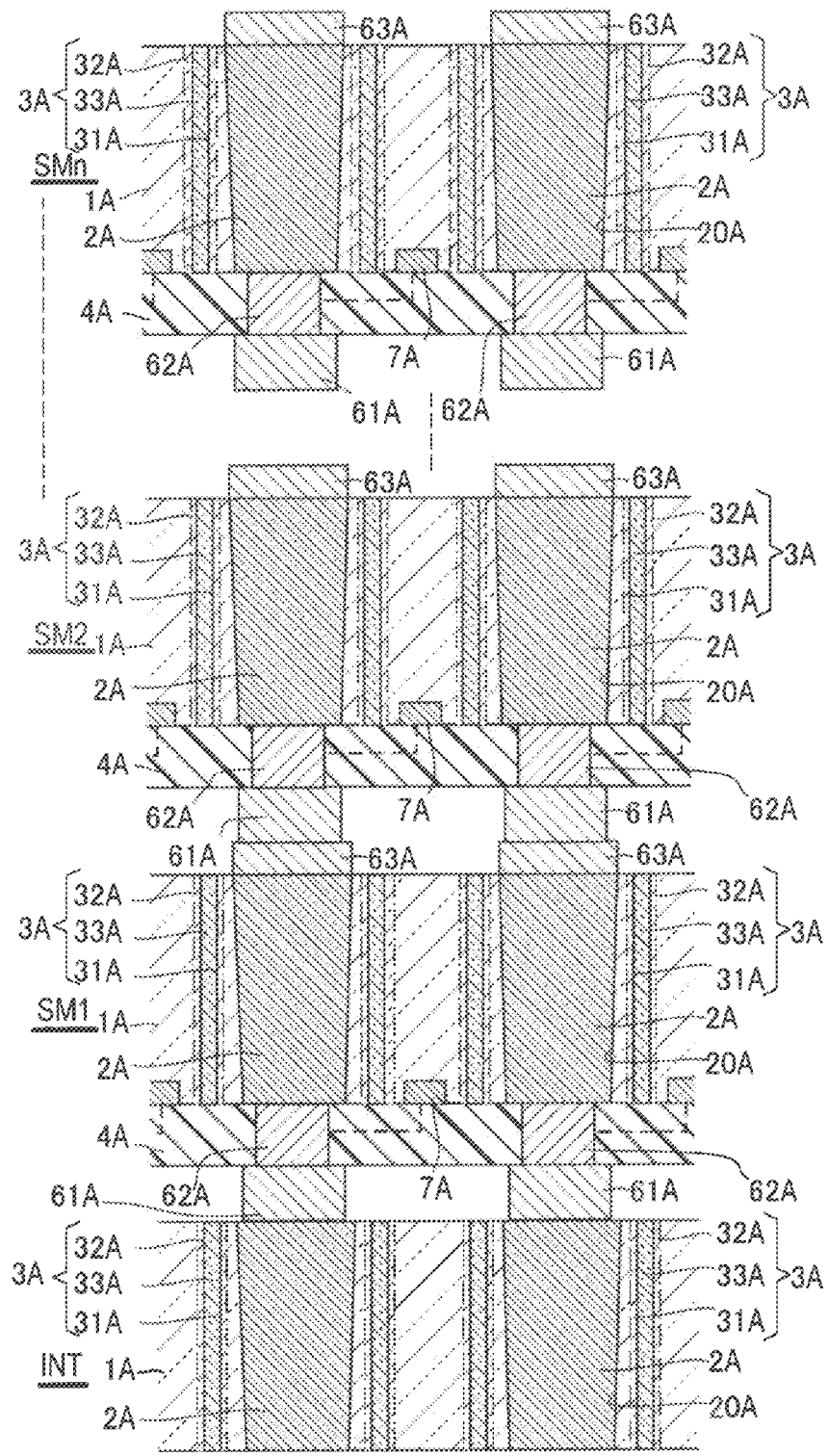
FIG. 2 is a sectional view taken along line II-II of FIG. 1.

As shown in FIGS. 1 and 2, typically, an electronic device according to the present invention is constructed in the form of a three-dimensional system-in-package (3D-SiP). Specifically, it may be a system LSI, a memory LSI, an image sensor, a MEMS, or the like. Examples of the electronic device also include an analog or digital circuit, a memory circuit such as DRAM, and a logic circuit such as CPU, or the electronic device may be formed such that different types of circuits, e.g., an analog high-frequency circuit and a low-frequency, low-power consumption circuit, are manufactured in different processes and then stacked together.

Figure 3:
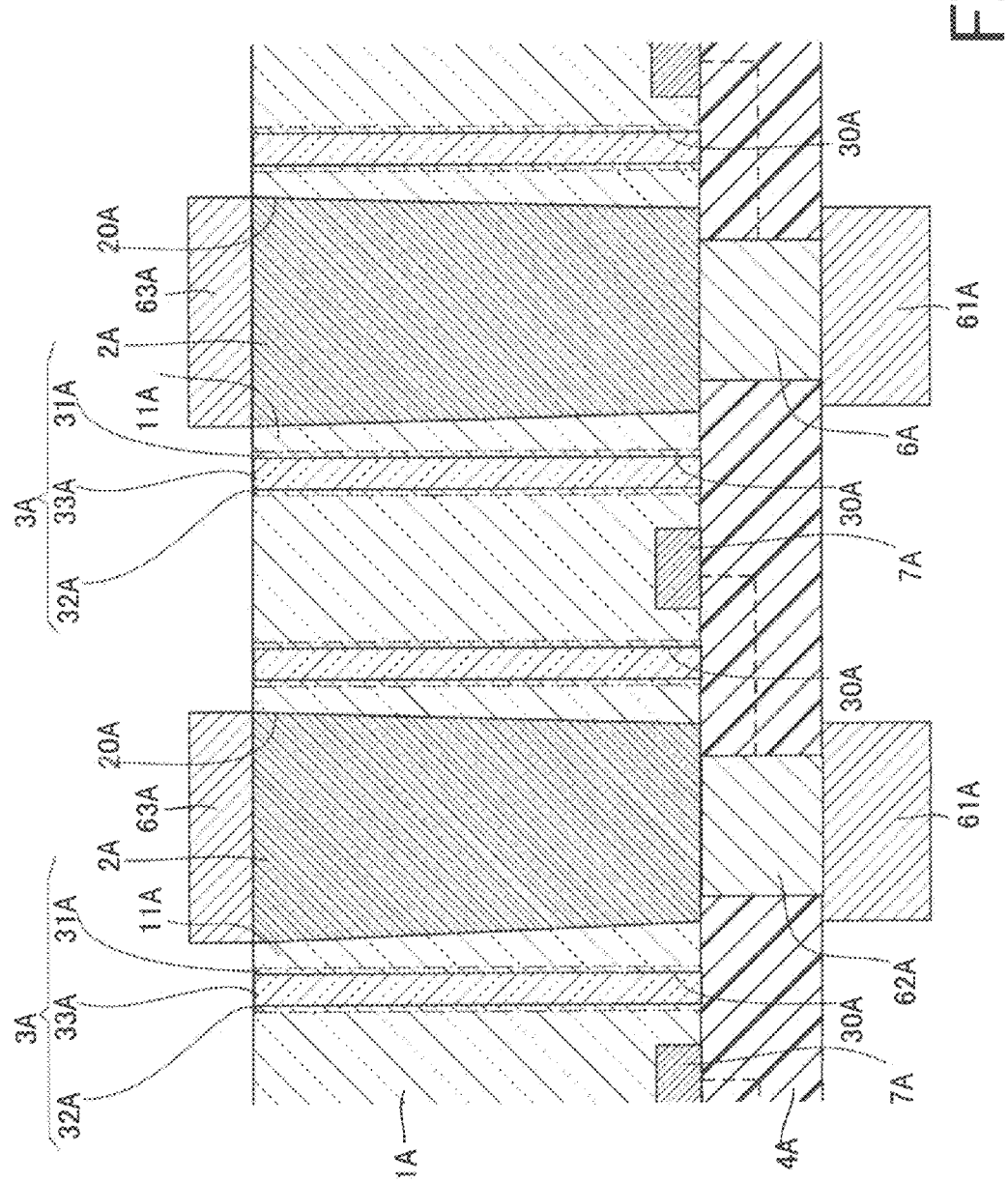
FIG. 3 is an enlarged sectional view showing a portion of the electronic device of FIGS. 1 and 2.

In the embodiment shown in FIGS. 1 and 2, the structure is such that substrates SM1 to SMn being semiconductor wafers or semiconductor devices are sequentially stacked and joined together on a substrate INT being an interposer. Referring to FIG. 3, each of the substrates SM1 to SMn includes a semiconductor substrate 1A, a columnar conductor 2A, and a ring-shaped insulator 3A. The semiconductor substrate 1A is, for example, a silicon substrate. The thickness of the semiconductor substrate 1A may be, but not limited to, about 50 to 700 (μm).

The columnar conductor 2A extends along the thickness direction of the semiconductor substrate 1A. The columnar conductors 2A are distributed in rows on a substrate surface. In this embodiment, the columnar conductor 2A is a through-conductor penetrating the semiconductor substrate 1A.

In an X-Y plane assumed on the substrate surface, as shown in FIG. 1, the columnar conductors 2A are arranged in rows, for example, in the form of matrix, at a given arrangement pitch Dx, Dy in X, Y directions. The arrangement pitch Dx, Dy of the columnar conductors 2A is, for example, in the range of 4 to 100 (μm), wherein a maximum diameter D1 is, for example, in the range of 0.5 to 25 (μm). However, the arrangement pitch Dx, Dy is not required to be constant, and the diameter D1 is not limited to the above value, either.

The columnar conductors 2A may be formed by applying a known technology such as a plating process, the above-described molten metal filling process, or a conductive paste filling process. Materials for forming the columnar conductor 2A may be different for different formation processes.

In the case of the plating process, a Cu plating film is widely used. In the case of the molten metal filling process, use can be made of a filling material containing at least one selected from the group consisting of Sn, In, Bi, Sb and Ga and at least one selected from the group consisting of Cr, Cu, Ag, Au, Pt, Pd, Ni, a Ni—P alloy and a Ni—B alloy.

Regardless of which formation process is adopted, a vertical hole (through hole via) 20A has to be formed previously. The vertical hole (through hole via) 20A may be formed by a known technology such as a CVD process or a laser drilling process.

The ring-shaped insulator 3A is disposed within a ring-shaped groove 30A that is provided in the semiconductor substrate 1A to surround the columnar conductor 2A. In the semiconductor substrate 1A, accordingly, the ring-shaped insulator 3A separates an inner ring-shaped portion 11A from an outer portion. Thus, the columnar conductor 2A can be electrically insulated from other adjacent columnar conductors 2A by the ring-shaped insulator 3A.

The ring-shaped groove 30A may be formed by the means used for formation of the vertical hole 20A. The ring-shaped groove 30A penetrates the semiconductor substrate 1A along the thickness direction and has a first inside diameter D2 larger than the diameter D1 of the vertical hole 20A in which the columnar conductor 20A is disposed. Between the inner peripheral surface of the vertical hole 20A and the inner peripheral surface of the ring-shaped groove 30A with the first inside diameter D2, accordingly, the semiconductor substrate 1A is left like an island by a diameter difference (D2−D1), providing the ring-shaped portion 11A.

The ring-shaped groove 30A also has a second inside diameter D3 separated from the first inside diameter D2 by a groove width. That is, the ring-shaped groove 30A has a groove width (D3−D2). The groove width (D3−D2) is set at a value which will not interfere with formation of the ring-shaped insulator. Its aspect ratio is 200 or less, preferably 100 or less.

The ring-shaped insulator 3A includes an inorganic insulating layer 33A. The inorganic insulating layer 33A is mainly composed of a glass and completely fills up the ring-shaped groove 30A. Thus, a dense insulating structure can be realized without any voids.

Figure 4:
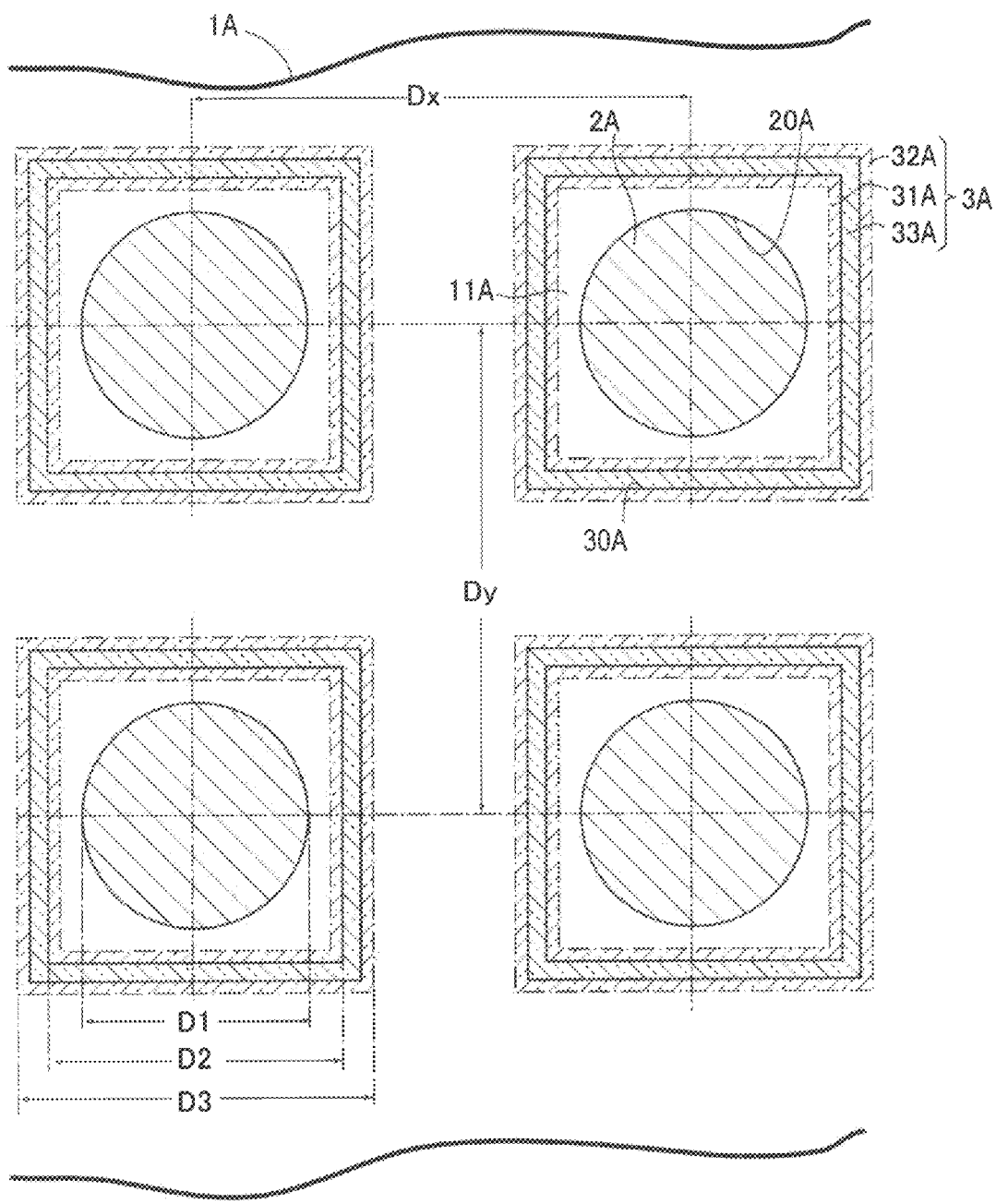
FIG. 4 is a plan view showing a portion of another embodiment of an electronic device according to the present invention.

The ring-shaped insulator 3A may be a single layer or may have a coaxially, spacedly arranged multilayer structure. In addition, its shape is not limited to the illustrated circular shape but may be a polygonal shape such as a rectangular shape shown in FIG. 4. Moreover, the columnar conductor 2A is not limited to the illustrated circular or cylindrical shape, either, but may have a prismatic shape.

The inorganic insulating layer 33A may be formed by filling a liquid glass, i.e., a glass paste into the ring-shaped groove 30A and then hardening it under pressure. Thus, the inorganic insulating layer 33A can be formed by a simple and inexpensive process of filling a liquid glass into the ring-shaped groove 30A and hardening it.

Furthermore, since the inorganic insulating layer 33A has a filled structure, there is no reason to decrease the groove width of the ring-shaped groove 30A unlike the prior art which requires a deposition process. This simplifies the formation process of the inorganic insulating layer 33A and, eventually, the formation process of the ring-shaped insulator 3A.

As an example of the glass filling process, there may be taken a process of pouring a liquid glass into the ring-shaped groove 30A under reduced-pressure atmosphere and then hardening the liquid glass within the ring-shaped groove 30A while pressurizing with a pressing pressure, a gas pressure or a rolling pressure applied thereto.

Various materials may be used as a glass material. For example, use can be made of a glass material containing at least one of $SiO_2$, PbO, $B_2O_3$, ZnO, MgO, $Al_2O_3$, $Na_2CO_3$, $CaCO_3$, $Na_2O$, CaO and $K_2O$. Among these glass materials, a material having a low relative permittivity and a high specific resistance may be selected for use. This enables adjustment of the relative permittivity and specific resistance of the ring-shaped insulator 3A as a whole, thereby reducing signal leakage in a high-frequency area and improving signal transmission characteristics.

In addition to the glass component, the inorganic insulating layer 33A may contain a ceramic component being a sintered compact, particularly, nm-sized ceramic particles. In this case, it is possible to select the relative permittivity and specific resistance for the ceramic component to be contained, which also enables adjustment of the relative permittivity and specific resistance of the ring-shaped insulator 3A as a whole, reducing signal leakage in a GHz scale high-frequency area and improving signal transmission characteristics.

Examples of the ceramic material include alumina ($Ai_2O_3$), mullite ($3Al_2O_3.2SiO_2$), cordierite ($2MgO.2Al_2O_3.5SiO_2$), steatite ($MgO.SiO_2$), forsterite ($2MgO.SiO_2$), silicon nitride ($Si_3N_4$), and aluminum nitride (AlN), whose specific resistance at a normal temperature exceeds $10^{14}(\Omega \cdot cm)$ and relative permittivity is in the range of 4 to 9.

The ring-shaped insulator 3A may further include insulating layers 31A, 32A. The insulating layers 31A, 32A preferably include an oxide layer, more preferably a nitride layer. The oxide layer and the nitride layer may be a single layer, multiple layers, or combinations thereof.

In addition, the oxide layer and the nitride layer may be a layer deposited on an inner surface of the ring-shaped groove 30A or a layer obtained by oxidizing or nitriding a surface of the semiconductor substrate 1A which appears on the inner surface of the ring-shaped groove 30A. With this insulating structure, a negative effect of the inorganic insulating layer 33A on the semiconductor substrate 1A can be blocked by the insulating layers 31A, 32A. For example, withstand voltage failure of an oxide film due to an alkali metal (Na, K) which may be contained in the above glass material, p-n junction leakage failure due to a transition metal (Fe, Cu, Zn), P-inversion failure due to a group 3 element (B, Al) and so on can be avoided by the insulating layers 31A, 32A.

In the present embodiment, the insulating layers 31A, 32A are formed by oxidizing or nitriding inner wall surfaces of the ring-shaped groove 30A. That is, the inner surfaces of the ring-shaped groove 30A are covered with the insulating layers 31A, 32A, and the inorganic insulating layer 33A fills the ring-shaped groove 30A covered with the insulating layers 31A, 32A.

If the semiconductor substrate 1A is a common silicon substrate, for example, the oxide layer is a silicon oxide layer and the nitride layer is a silicon nitride layer. The silicon oxide layer and the silicon nitride layer may be formed by applying a known technology. For example, there have been known a process of oxidizing or nitriding a surface of a silicon substrate and a process of depositing an insulating layer using a chemical vapor deposition process (CVD process), and either process may be employed. The oxidizing or nitriding depth of the insulating layers 31A, 32A, i.e., substantial layer thickness is preferably determined in view of actually required transmission characteristics.

Generally speaking, the silicon nitride layer is superior in insulating characteristics to the silicon oxide layer. In addition, the nitride layer has excellent chemical stability, electrical insulation, thermal shock resistance, and thermal deformation resistance. From a general point of view, therefore, the insulating layers 31A, 32A are preferably comprised of a silicon nitride layer.

Moreover, when the insulating layers 31A, 32A are comprised of a silicon nitride layer, they have excellent chemical stability, thermal shock resistance, and thermal deformation resistance. Accordingly, there can be realized a separate insulating structure having excellent chemical stability, thermal shock resistance, and thermal deformation resistance.

Referring to FIG. 3, semiconductor devices 7A are formed on one side of the semiconductor substrate 1A being a silicon substrate. The columnar conductor 2A penetrates the semiconductor substrate 1A along the thickness direction, and at its one end, a connection electrode 62A and an overlying electrode 61A for external connection are sequentially joined together. The semiconductor devices 7A are connected to the connection electrodes 62A through undepicted wiring. The semiconductor devices 7A and the connection electrodes 62A are covered with an insulating film 4A provided on one side of the semiconductor substrate 1A. On the other hand, an electrode 63A for external connection is also connected to the other end of the columnar conductor 2A.

At least one of the connection electrodes 62A, 63A may be continuous with the columnar conductor 2A as an integral part thereof. In FIG. 2, furthermore, an insulating resin is preferably filled into a gap between adjacent ones of the substrates SM1 to SMn, for example, between the substrates SM1 and SM2.

Figure 5:
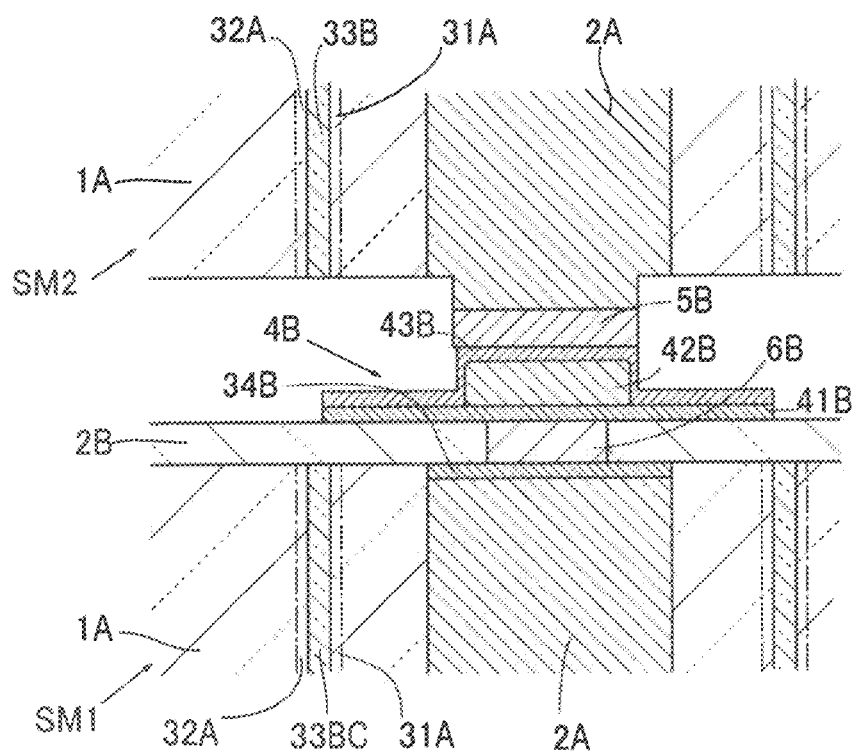
FIG. 5 is a sectional view showing an embodiment of a substrate connecting structure in the electronic device of FIGS. 1 to 4.

With reference to FIG. 5, next will be described an electronic device capable of preventing thermal deterioration which may occur when joining the columnar conductors between the substrates SM1 to SMn. Referring to FIG. 5, a connection conductor 4B includes a first electrode film 41B, a second electrode film 42B, and a third electrode film 43B. The first electrode film 41B is a member for serving as a lead-out electrode for a connection 6B and has a pattern for continuously covering the surface of the connection 6B and an insulating layer 2B. The second electrode film 42B is disposed above the connection 6B and joined to the surface of the first electrode film 41B.

The third electrode film 43B is joined onto the second electrode film 42B and the first electrode film 41B. The third electrode film 43B is comprised of a noble metal film and serves as an antioxidizing film for flux-less joining. The noble metal film comprising the third electrode film 43B preferably contains at least one selected from the group consisting of Ag, Au, Pd and Pt. In addition, the noble metal film preferably has a film thickness of 100 (nm) or less. Within this range, its inherent antioxidizing effect can be exhibited while suppressing increase of the film thickness with respect to an overall film thickness.

It is obviously seen from FIG. 5 that between adjacent ones of the plurality of substrates SM1 to SMn, for example, between the substrates SM1 and SM2, the columnar conductor 2A of one substrate SM2 is connected to the connection conductor 4B of the other substrate SM1 through a junction film 5B.

The junction film 5B contains a first metal or alloy component and a second metal or alloy component having a higher melting point than the first metal or alloy component, whereby a melting temperature is made higher than the melting point of the first metal or alloy component.

With the above composition of the junction film 5B, when a heat treatment is performed for joining, the small size effect due to the small film thickness of the junction film 5B allows the second metal or alloy component to melt at a temperature close to the melting point of the first metal or alloy component. At this time, of course, the first metal or alloy component can also be melted. Then, since the first metal or a low melting point metal of the alloy component is consumed by reacting with the connection conductor 4B and forming an intermetallic compound, the melting point increases considerably after joining.

In the electronic device being a finished product after solidification, moreover, since the melting temperature of the junction film 5B after solidification is mainly dominated by the melting point of the second metal or alloy component, the melting temperature of the junction film 5B increases to a temperature close to the melting point of the second metal or alloy component, i.e., a temperature that is higher the melting point of the first metal or alloy component at the very least.

According to the present invention, therefore, it is possible to realize a highly heat-resisting electronic device which requires a low heat treatment temperature during the joining process but can secure a high melting point after solidification.

The first metal or alloy component preferably contains at least one selected from the group consisting of Sn, In, Bi, Sb and Ga. On the other hand, the second metal or alloy component preferably contains at least one selected from the group consisting of Cr, Cu, Ag, Au, Pt, Pd, Ni, a Ni—P alloy and a Ni—B alloy.

When manufacturing the electronic device of FIG. 5, between the adjacent substrates SM1 and SM2, the junction film 5B, which contains the first metal or alloy component and the second metal or alloy component having a higher melting point, is formed on the connection conductor 4B of the substrate SM1, or the junction film 5B, which contains the first metal or alloy component and the second metal or alloy component, is formed on the end face of the columnar conductor 2A of the substrate SM2.

Of course, the junction film 5B may be formed on both sides. The first metal or alloy component and the second metal or alloy component are comprised of the above metal materials. The junction film 5B may be formed by applying a known film formation technology such as film transfer, printing, sputtering, and electron beam evaporation.

Then, the substrates SM1 and SM2 are stacked in alignment with each other. Thus, only the junction film 5B lies between one end of the columnar conductor 2A of the substrate SM2 and the connection conductor 4B of the substrate SM1. The junction film formation process and the aligning and stacking process are repeated according to the number of required layers.

Then, the first metal or alloy component and the second metal or alloy component contained in the junction film 5B are melted by a heat treatment. In the melting process, the heat treatment is performed such that the already solidified columnar conductor 2A will not be melted again. Thereafter, the junction film is solidified by natural cooling or forced cooling. Thus, there is obtained the electronic device shown in FIGS. 1 and 2.

In the above heat treatment process, since the junction film 5B has a melting point reducing effect due to the small size effect of the film thickness, the second metal or alloy component can be melted at a temperature lower than its melting point, along with the first metal or alloy component, thereby avoiding thermal damage to the connection 6B and so on.

After solidification, the melting temperature of the junction film 5B rises almost to the melting point of the second metal or alloy component. Thus, there is obtained a highly heat-resisting electronic device.

With the above results being further developed, needless to say, similar effects can be obtained even when metal balls whose surface is coated with the first metal or alloy, e.g., Cu or Ni balls, are used for the junction film 5B. If combined, it will also be effective as a method for securing a space between wafers.

Figure 6:
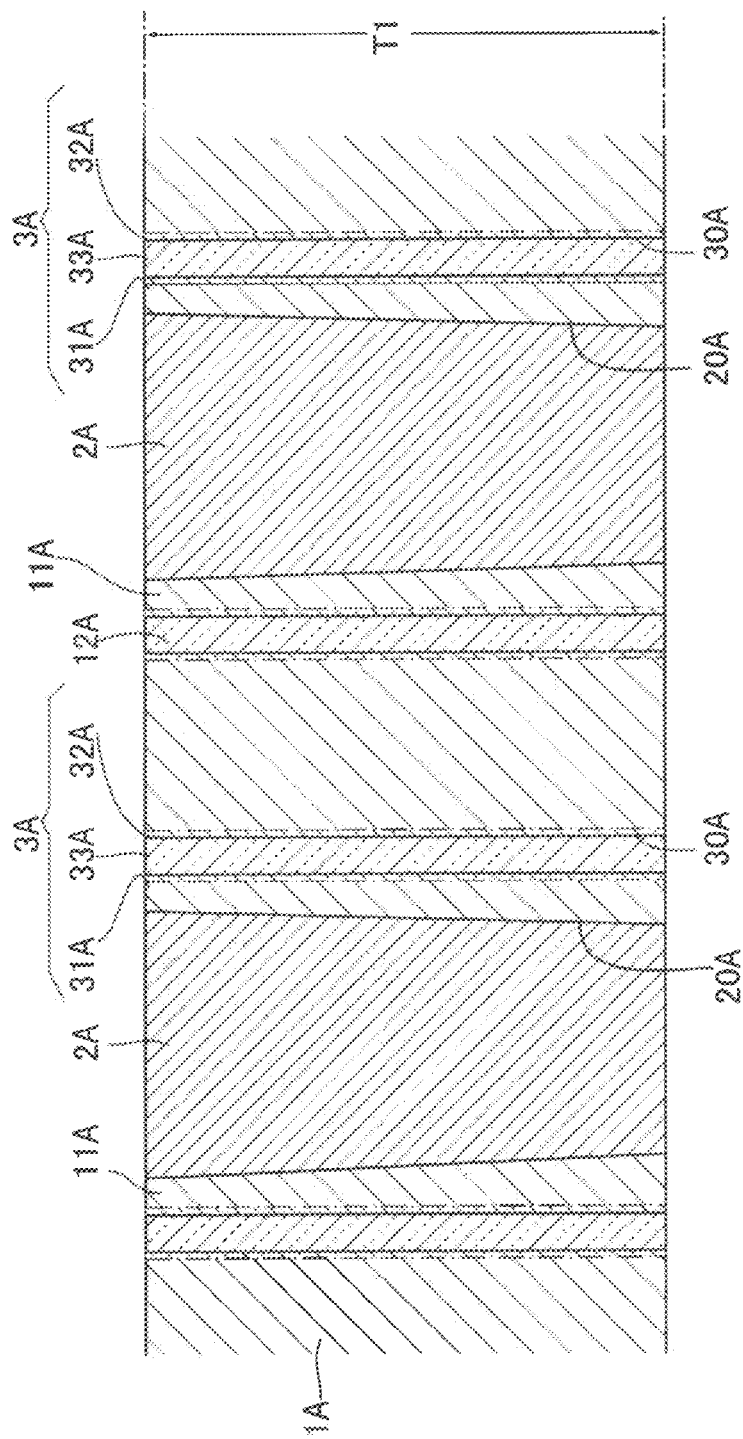
FIG. 6 is a sectional view of an interposer to be used for an electronic device according to the present invention.

As already shown in FIG. 2, the electronic device according to the present invention may also include the interposer INT in addition to the semiconductor substrates. FIG. 6 shows one embodiment of the interposer. In FIG. 6, the portions corresponding to the components shown in FIGS. 1 to 5 are indicated by the same reference symbols to avoid duplicative explanation. The interposer differs from the substrates SM1 to SMn shown in FIGS. 1 to 5 in that it has no semiconductor device and is not necessarily provided with the insulating film 4A and the connection electrodes 61A, 62A, 63A. However, at least one of the connection electrodes 62A, 63A may be continuous with the columnar conductor 2A as an integral part thereof.

Although not shown in the drawings, when manufacturing the electronic device shown in FIGS. 1 and 2, furthermore, the substrates SM1 to SMn can be efficiently stacked on the interposer INT such that the substrate SM1, which is previously formed with the columnar conductor 2A, is stacked and joined onto the interposer INT, an insulating resin is filled into a gap formed between the interposer INT and the substrate SM1, and the surface of the substrate SM1 is then polished to expose an end face of the columnar conductor 2A, which is followed by repeating the steps of stacking and joining the next substrate SM2 and filling the insulating resin into a gap formed between the substrate SM1 and the substrate SM2 and so on.

2. Conductive Composition

Figure 7:
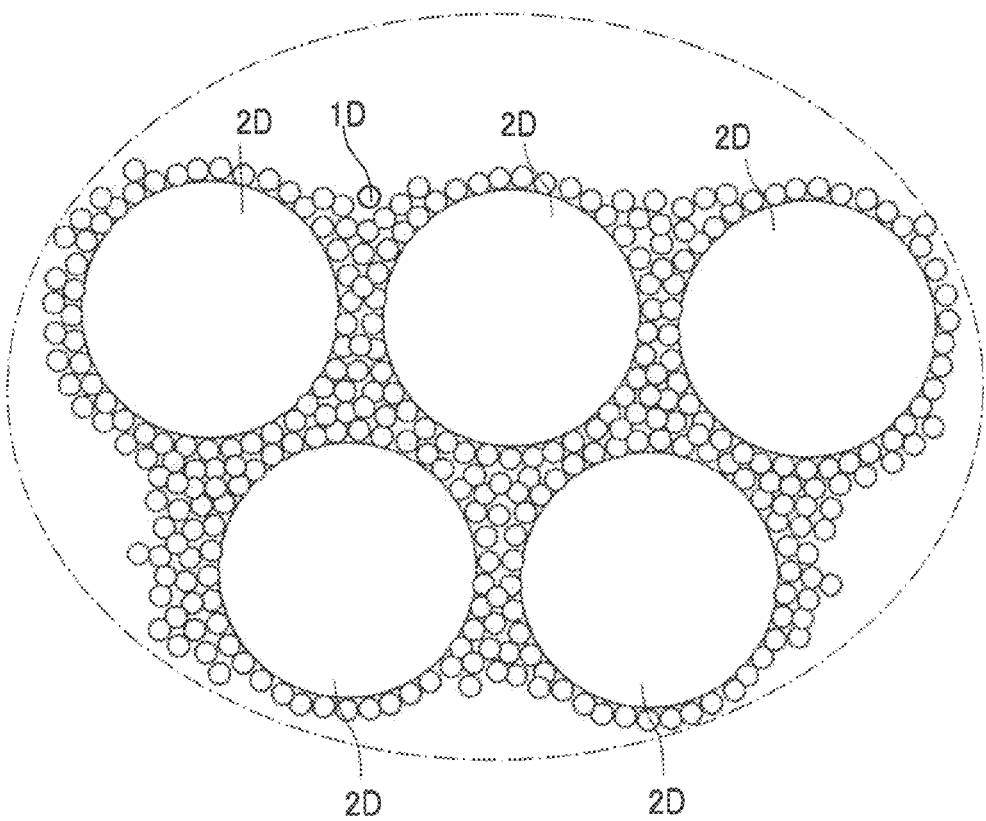
FIG. 7 is a schematic enlarged view showing a conductive composition according to the present invention.

Next will be described a conductive composition suitable for forming the columnar conductor and the junction film in the electronic device according to the present invention. Referring to FIG. 7, a conductive composition according to the present invention includes first metal particles 1D and second metal particles 2D.

The first metal particles 1D have an average particle size in such a nm range as to exhibit small size effect, enabling melting at a temperature lower than their melting point. In the present invention, the term "nm range" refers to the range of 100 (nm) or less.

The second metal particles 2D have a melting point in such a range that their melting can be caused by melting of the first metal particles 1D. The first and second metal particles 1D, 2D may be a single crystal or a polycrystal. Preferably, the first and second metal particles 1D, 2D are spherical in shape.

In the present invention, since the first metal particles 1D have an average particle size in such a nm range as to exhibit small size effect, enabling melting at a temperature lower than the melting point of their material, it can be melted at a temperature lower than the melting point. Particularly when the particle size (average particle size) of the first metal particles 1D is 20 (nm) or less, they exhibit the quantum size effect and are therefore allowed to melt at a temperature that is considerably lower than a melting point of a constituent material, for example, 250° C. or less, preferably, 200° C. or less, more preferably, 180° C. or less.

Specifically, the first metal particles 1D may be made of a material containing at least one selected from the group consisting of Ag, Cu, Au, Pt, Ti, Zn, Al, Fe, Si and Ni. Here, the melting point of Ag is 961.93° C., the melting point of Cu is 1083.4° C., the melting point of Au is 1064.43° C., the melting point of Pt is 1769° C., the melting point of Ti is 1660° C., the melting point of Zn is 419.58° C., the melting point of Al is 660.4° C., the melting point of Fe is 1535° C., the melting point of Si is 1410° C., and the melting point of Ni is 1453° C.

Because of the quantum size effect, the first metal particles 1D made of such a high melting point metal material are allowed to melt at a temperature of, for example, about 250° C., preferably, 200° C. or less. In order to obtain the junction structure, however, it is necessary to select a metal component from the above group in view of the joining ability to an object to be joined.

The conductive composition according to the present invention includes not only the first metal particles 1D but also the second metal particles 2D. Melting of the first metal particles 1D causes melting of the second metal particles 2D. Thus, the second metal particles 2D can be melted along with melting of the first metal particles 1D.

The second metal particles 2D may be made of a material that can melt at a reduced melting temperature of the first metal particles 1D. Specifically, such a material may be at least one selected from the group consisting of Sn, In and Bi. The melting point of Sn is 232° C., the melting point of In is 156.61° C., and the melting point of Bi is 271.3° C. In view of the meltability, preferably, the second metal particles 2D have an average particle size in the range of 1 to 300 μm.

If bismuth (Bi) is selected for the second metal particles 2D, a metal conductor without any cavities or voids within the minute space can be formed with the above metal filling apparatus by utilizing volume expansion characteristics during cooling.

In order to form an electrode such as a columnar conductor, a junction film, and a wiring conductor pattern on a chip or wafer using the conductive composition according to the present invention, the conductive composition should be solidified after melting. At this time, the melting temperature decreases to a level considerably lower than the melting point of the first metal particles 1D, so that the columnar conductor, the junction film, or the wiring conductor pattern can be formed without causing thermal deterioration of a previously formed semiconductor circuit element. For formation of the columnar conductor, use can be made of the apparatuses illustrated in FIGS. 30 to 42.

Although the first metal particles 1D are allowed to melt, for example at about 250° C., this is because their melting point is considerably reduced by the small size effect and the quantum size effect, and the melting point of the constituent metal material of the first metal particles 1D is much higher than the actual melting temperature, as described above. Accordingly, heat resistance due to the high melting point of the first metal particles 1D can be secured after solidification. If the first metal particles 1D is made of at least one selected from the group consisting of Ag, Cu, Au, Pt, Ti, Zn, Al, Fe, Si and Ni, for example, heat resistance due to the high melting point of these materials can be secured after solidification.

Although the compositional ratio of the first metal particles 1D to the second metal particles 2D varies depending on the selected materials, the effects of the present invention can be obtained as long as the ratio of the first metal particles 1D to the total (weight) of the first metal particles 1D and the second metal particles 2D is in the range of 1 to 50% by weight.

The conductive composition according to the present invention may be used as it is in the form of a powder where the first metal particles 1D and the second metal particles 2D are mixed together, or may be used in the form of a conductive paste where the powder is mixed with an organic vehicle.

The metal particles according to the present invention may be manufactured by a commonly known nanoparticle production process. For example, they may be manufactured by a crushing process where a mass of material is crushed to a nanometer-size using a ball mill or jet mill, an aggregation or reduction process where an ion or complex being a material is reduced by a reducing agent or electrochemically and aggregated into nanoparticles, a thermal decomposition process where a material is thermally decomposed as it is or while being supported by a carrier, a physical vapor deposition (PVD) process such as a gas evaporation process, a laser evaporation process where rapid evaporation is caused by laser, and a chemical vapor deposition (CVD) process where chemical reaction is brought about in a gaseous phase.

In addition to the above common production processes, it may also be manufactured by a centrifugal granulation process. According to the centrifugal granulation process, under an argon inert gas atmosphere, there are carried out the steps of supplying a molten metal or alloy being a material of the first or second metal particles onto a high-speed rotating dish disk, spattering it into droplets by the action of a centrifugal force, and rapidly cooling them into spherical particles by contact with the gas atmosphere.

In the granulation process, the molten material is self-assembled during the rapid cooling and solidification, resulting in a composite structure of crystals or amorphous bodies.

The term "composite structure" as used herein refers to a structure in which individual microcrystals are separated from each other by scattered materials or voids. The spherical particles are aggregates of different crystals or amorphous bodies. On the other hand, the term "self-assembling" refers to formation of a composite structure due to aggregation of constituent crystals or amorphous bodies in the process of supplying a molten material onto a high-speed rotating dish disk, spattering it into droplets by the action of a centrifugal force, and rapidly cooling and solidifying them into spherical particles.

According to the centrifugal granulation process, typically, there are obtained metal particles in the range of 1 to 300 µm, which satisfies the average particle size of the second metal particles 2D. In order to obtain much smaller particles, the metal particles obtained by the centrifugal granulation process may be decomposed by a plasma treatment and again subjected to the centrifugal granulation process. This provides spherical ultrafine particles which satisfy the average particle size of the first metal particles 1D.

The conductive composition according to the present invention may be contained as a filling material in a molten metal MC of the above metal filling apparatus or may be used as an electrode material for forming wiring patterns on a substrate surface. If the electronic device is a three-dimensional system-in-package (3D-SiP), furthermore, it may also be used as a junction material for joining electrodes formed on stacked substrates.

As described above, since the conductive composition according to the present invention can be melted at a low temperature and secure a high melting point after solidification, regardless of which one of the electrode material, the filling material and the junction material is its application, it is possible to realize a highly reliable electronic device.

3. Columnar Conductor (Equiaxed Crystallization)

Next will be described equiaxed crystallization of the columnar conductor that is suitable for preventing the occurrence of cracking in the above columnar conductor or the insulating film disposed between the columnar conductor and the through-hole.

Figure 8:
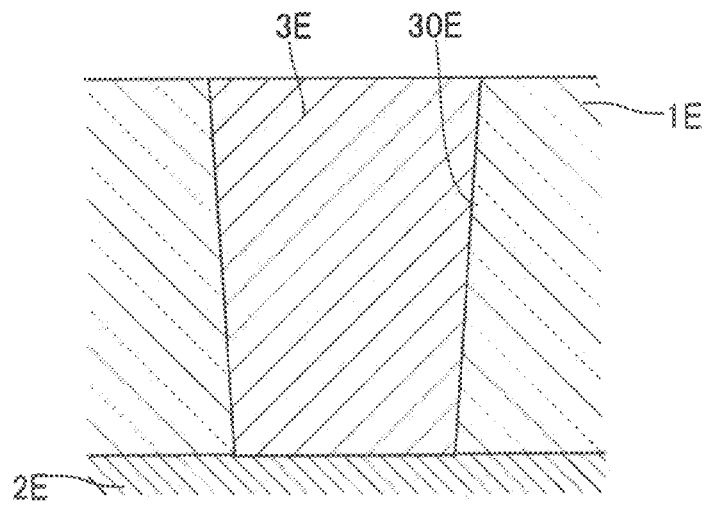
FIG. 8 is a schematic sectional view showing one embodiment of a substrate to be used for an electronic device according to the present invention.

FIG. 8 shows one embodiment of a substrate to be used for an electronic device according to the present invention. A columnar conductor 3E is made of a metal or alloy and fills a minute space 30E extending from one surface of a substrate 1E along a thickness direction. Such a structure can be obtained, for example, by a metal filling apparatus that will described later.

One end of the columnar conductor 3E is opposed to a surface of a bottom layer 2E closing the bottom of the minute space 30E. The bottom layer 2E may be any one of a conductor, an insulator, and a semiconductor, but will be described here as a thin-film conductor.

Although FIG. 8 shows a substrate of a simple structure, it may actually have a more complicated structure in order to realize appropriate function and structure depending on the type of the electronic device. The substrate may be a wafer or a chip cut out of the wafer. Moreover, it may be a single layer substrate or a multilayer substrate in which a plurality of layers are stacked.

For the substrate 1E, various materials may be used as long as having a certain heat resistance, including a metal, an alloy, a metal oxide, a ceramic, a glass, a plastic, a composite thereof, and a laminate thereof. The physical properties and structure of the substrate 1E vary depending on the type of the target device.

For a semiconductor device, for example, use can be made of Si, SiC, SOI or the like. For a passive electronic circuit device, it may take the form of a dielectric, a magnetic or a composite thereof. Also when realizing a MRAM (magnetoresistive random access memory), a MEMS (micro electro mechanical systems), an optical device, a solar cell, a flat display such as an EL display, a liquid crystal display, or a plasma display, a wafer to be used should have physical properties and structure meeting the requirements. If the substrate 1E is a semiconductor substrate, it is possible to previously form a semiconductor circuit element.

The bottom layer 2E is formed on one side of the substrate 1E. If the substrate 1E is a semiconductor wafer and a semiconductor circuit element is formed previously, the bottom layer 2E may serve as an electrode for the semiconductor circuit element. In this case, the bottom layer 2E may have various planar patterns depending on required functions. If needed, the area around the bottom layer 2E may be filled with an insulating film.

The bottom layer 2E is made of a known material such as a metal material mainly composed of Cu. If needed, it may contain Zn (zinc), Al (aluminum) or Ti (titanium). The bottom layer 2E may be formed by a thin-film formation technology such as CVD or sputtering.

Although the present embodiment illustrates the case where a single columnar conductor 3E is provided for a single bottom layer 2E, it should not be construed as limited thereto. It is also possible to provide a plurality of columnar conductors 3E for a single bottom layer 2E. The minute space 30E is a through-hole or a non-through-hole (blind hole) as described above.

Figure 9:
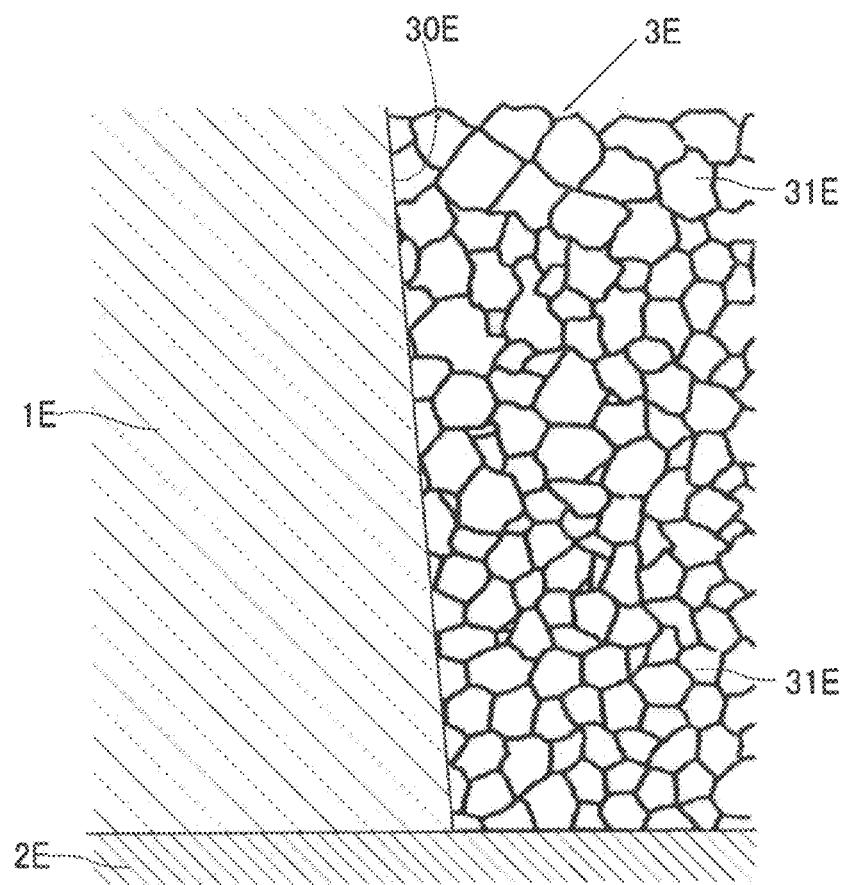
FIG. 9 is a schematic enlarged view showing an equiaxed crystal structure of the electronic device substrate of FIG. 8.

The columnar conductor 3E is made of a melt-processed metal and has an area of an equiaxed crystal 31E at an area opposed to the substrate 1E, as shown in FIG. 9 on an enlarged scale. The equiaxed crystal 31E area may be distributed entirely over the columnar conductor 3E or partially or entirely over a peripheral area of the columnar conductor 3E opposed to the substrate 1E. With the columnar conductor 3E having the equiaxed crystal 31E area, there can be obtained a highly reliable, high quality substrate which hardly causes cracking of the columnar conductor 3E, cracking of the substrate 1E or breaking of the insulating film.

Figure 10:
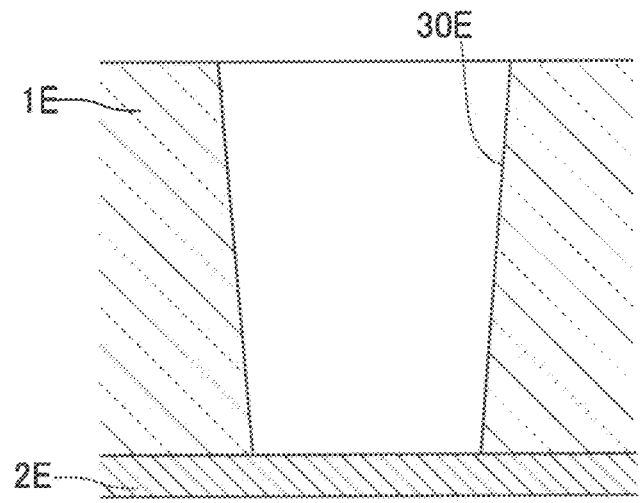
FIG. 10 is a view showing a production process of the substrate of FIGS. 8 and 9.
Figure 11:
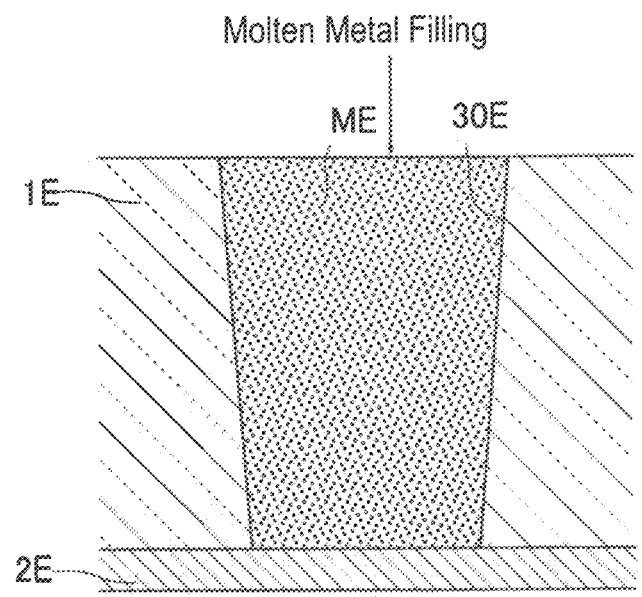
FIG. 11 is a view showing a step after the step of FIG. 10.

Using the macrostructure theory about the melt-processed metal, the reason can be explained as follows. When forming the columnar conductor 3E by melt-processing, specifically, the hole-like minute space 30E formed in the substrate 1E is used as a mold, as shown in FIG. 10, and a molten metal ME is then filled into it and solidified, as shown in FIG. 11. At this time, three structural areas of a chill layer, a columnar crystal and an equiaxed crystal can be assumed as a general form of a crystal grain that will be generated upon solidification of the molten metal ME. The columnar crystal is a crystal zone arrayed and elongated in parallel to the direction of heat flow. The equiaxed crystal is a uniform isometric crystal area and has isotropy. The equiaxed crystal has a smaller crystal grain size than the chill layer.

Figure 12:
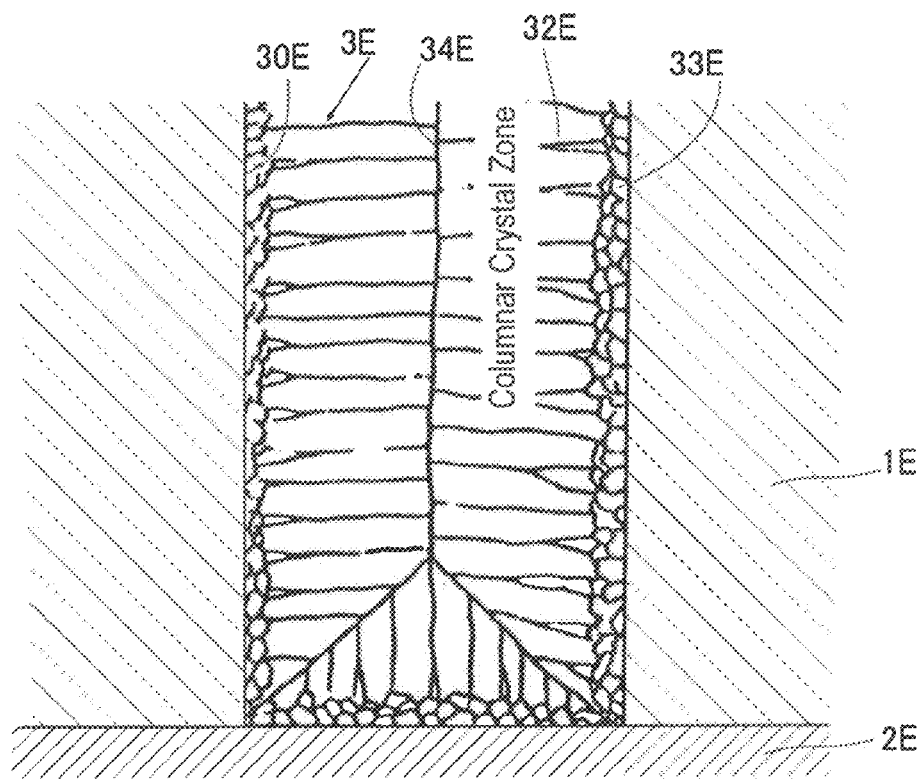
FIG. 12 is a schematic sectional view showing a substrate in which a columnar crystal structure is predominant.
Figure 13:
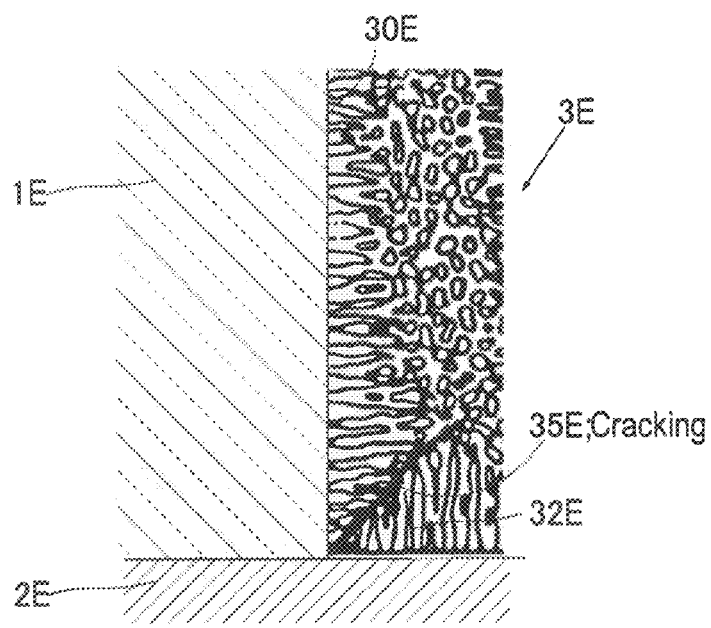
FIG. 13 is a schematic view showing a problem of the substrate of FIG. 12.

In this case, the most important factor determining the material properties of the columnar conductor 3E obtained by solidifying the molten metal ME is a relative ratio of the columnar crystal zone to the equiaxed crystal area. If the columnar conductor 3E obtained by solidification has only a columnar crystal 32E and a chill layer 33E without any equiaxed crystal area, as shown in FIG. 12, impurities having solid solubility and impurities having no solid solubility in the molten metal are concentrated at an area where structures of the columnar crystal 32E collide with each other, causing severe segregation. In addition, the columnar crystal 32E inherently grows into a large grain. Accordingly, a grain boundary 34E easily serves as a propagation path of cracking, causing cracking of the columnar conductor 3E and cracking of the substrate 1E, as schematically shown in FIG. 13. In the case where an insulating film is put on an inner surface of the minute space 30E (which will be described later), the insulating film may be broken by the large grain growth of the columnar crystal structure.

To the contrary, since the equiaxed crystal structure is isotropic and has a small grain size, it does not cause segregation easily unlike the case of the columnar crystal. In the present invention, since the columnar conductor 3E has the equiaxed crystal 31E area at least in an area opposed to the substrate 1E, there is obtained the isotropy due to the equiaxed crystal structure. This suppresses the occurrence of cracking of the conductor, breaking of the insulating film, and cracking of the substrate.

At least in a peripheral surface area opposed to the substrate 1E, preferably, the equiaxed crystal area accounts for a larger area of the columnar conductor 3E than the columnar crystal area. With this relationship, the isotropy of the equiaxed crystal becomes more predominant at least in the area opposed to the substrate 1E, which suppresses more effectively cracking of the conductor, breaking of the insulating film, and cracking of the substrate.

In order to develop the equiaxed crystal structure, it is necessary to suppress the growth of the columnar crystal, which can be achieved by arranging the condition suitable for nucleation of the equiaxed crystal. The necessary condition is such that a crystal network structure has to be formed within the molten metal as an obstacle which prevents the growth of the columnar crystal. As such means, the following two methods are known.

(a) Control melt-processing conditions and use an inoculant
(b) Apply mechanical or ultrasonic vibration to induce dynamic grain refinement In the present invention, the above methods (a) and (b) may be used either alone or in combination with each other. In the case of choosing the method (a), it has been found that gallium (Ga) or bismuth (Bi), which has a negative volume change, is effective as an inoculant. In addition, use can be made of indium (In). For the molten metal, use can be made of metal elements commonly used for formation of such a conductor. Examples include Sn, Cu, Ag, Al and Au. Since preferred values of composition ratio of these metals to the inoculant vary depending on the type of a selected metal and temperature, pressure and so on during the melt-processing, they are preferably determined empirically and experimentally. However, the equiaxed crystal is not necessarily required to be formed by melt-processing. Other possible means may be used, if any.

When forming the columnar conductor 3E by melt-processing, use can be made of, but not limited to, composite spherical particles having a particle size of 1 μm or less and an internal crystal structure of 200 nm or less.

Figure 14:
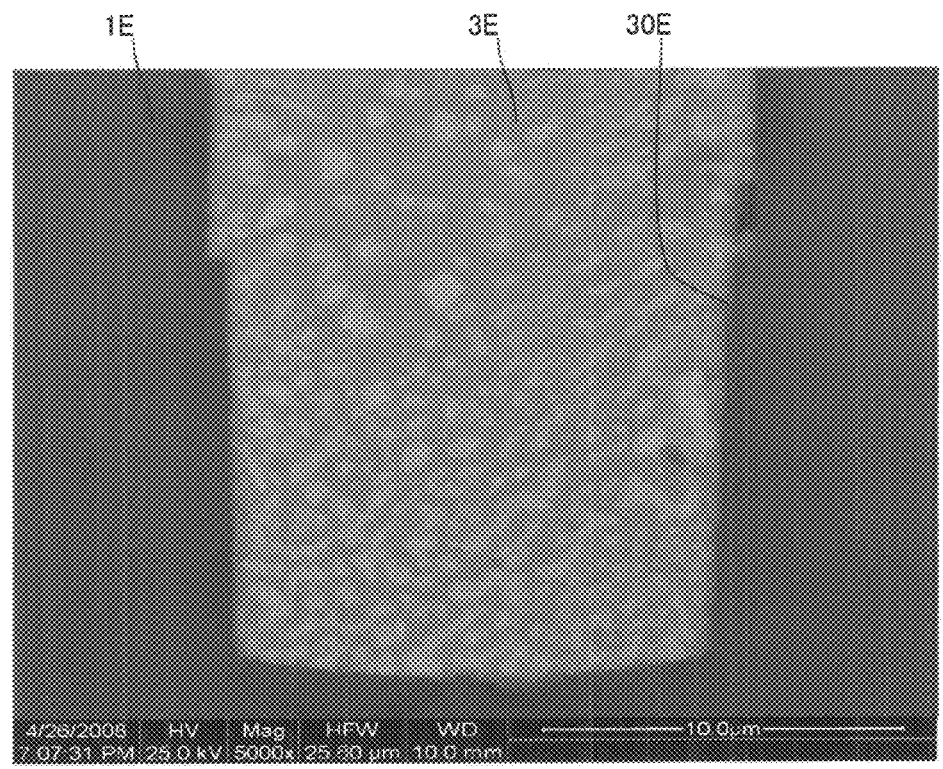
FIG. 14 is a SEM photograph of a substrate to be used for an electronic device according to the present invention.
Figure 15:
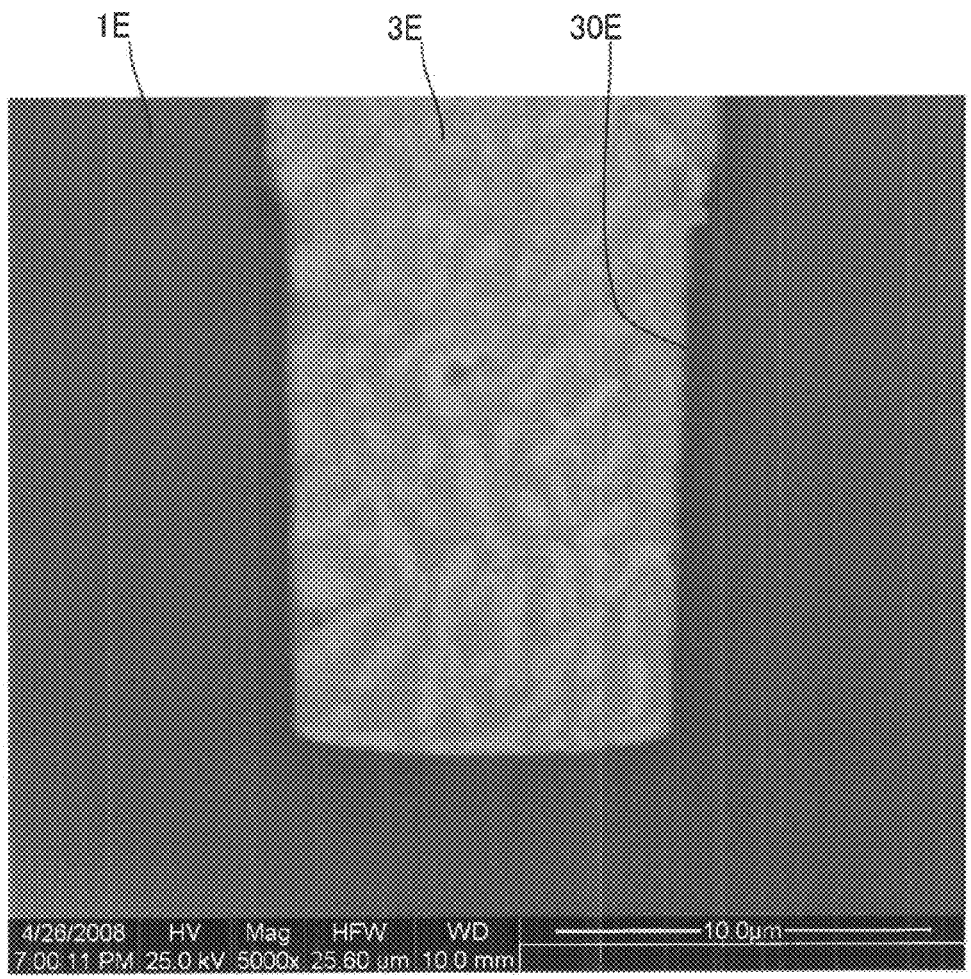
FIG. 15 is a SEM photograph of a substrate being a comparative example.

FIG. 14 is a SEM photograph of a substrate according to the present invention, while FIG. 15 is a SEM photograph of a substrate being a comparative example to which the present invention was not applied, and in either case, the columnar conductor 3E filled the minute space 30E bored into the substrate 1E. In FIGS. 14 and 15, the columnar conductors 3E had the same main component but differed from each other in that bismuth (Bi) was contained as an inoculant in FIG. 14 but bismuth (Bi) was not contained in FIG. 15. As described above, bismuth (Bi) may be replaced by gallium (Ga) or indium (In).

It is apparent from the comparison of FIG. 14 with FIG. 15 that in the substrate of FIG. 15, the columnar conductor 3E has many elongated crystals representing columnar crystals, but in the substrate of FIG. 14 according to the present invention, the columnar conductor 3E has fine crystals representing equiaxed crystals. The equiaxed crystal structure of FIG. 14 suppresses the occurrence of cracking of the conductor, breaking of the insulating film, and cracking of the substrate, which would become a problem in the columnar crystal structure of FIG. 15.

Figure 16:
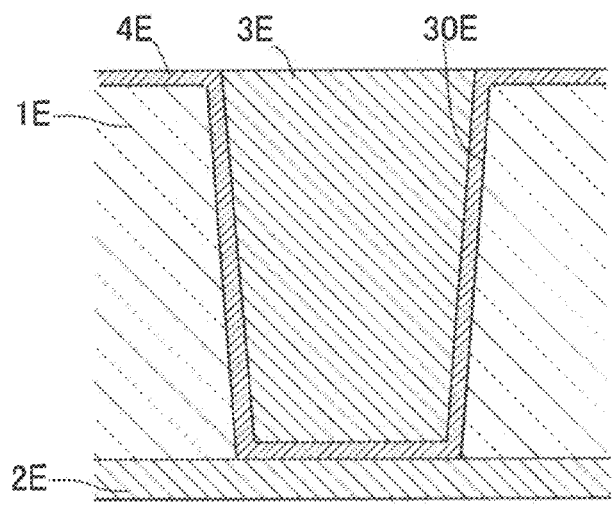
FIG. 16 is a schematic sectional view showing another embodiment of a substrate to be used for an electronic device according to the present invention.

FIG. 16 shows another embodiment of a substrate according to the present invention. In this figure, the components corresponding to the components shown in FIG. 8 are indicated by the same reference symbols to avoid duplicative explanation. The present embodiment is characterized in that a foundation layer 4E for serving as a junction film is joined to almost the entire peripheral surface of the columnar conductor 3E within the minute space 30E. The foundation layer 4E may be formed by a thin-film formation technology such as sputtering.

Also in the embodiment of FIG. 16, the columnar conductor 3E is made of a metal or alloy and has an equiaxed crystal area at least in a peripheral area opposed to the foundation layer 4E. This avoids the problem that cracking of the columnar conductor 3E, the foundation layer 4E or the substrate 1E is caused by the grain growth of the columnar crystal structure.

When forming the columnar conductor 3E by melt-processing, moreover, metal materials capable of forming an intermetallic compound may be selectively used as a metal component for forming the columnar conductor 3E and the foundation layer 4E, so that these 3E, 4E can be firmly joined together with the intermetallic compound.

4. Junction Structure Between Columnar Conductor and Other Conductors

Next will be described preferred embodiments of the junction structure between the columnar conductor and other conductors.

(1) First Embodiment

Figure 17:
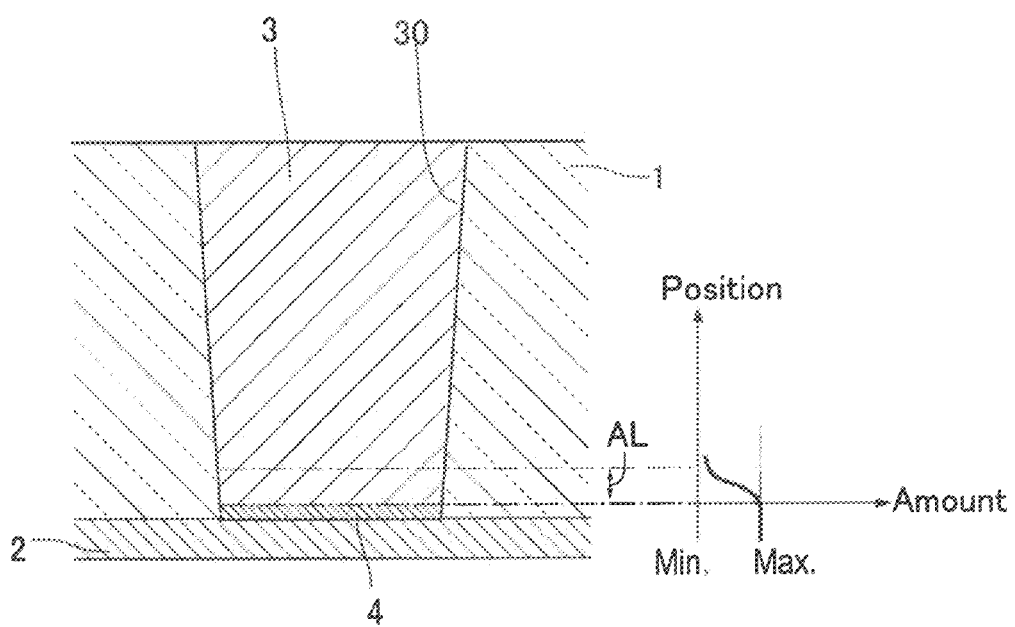
FIG. 17 is a view showing still another embodiment of a substrate to be used for an electronic device according to the present invention.

Referring to FIG. 17, a columnar conductor 3 fills a minute space 30 extending along the thickness direction from one surface of a substrate 1. At the bottom of the minute space 30, one end of the columnar conductor 3 is opposed to a film surface of a first conductor 2 across a junction film 4.

Although FIG. 17 illustrates the case where a single columnar conductor 3 is provided for a single first conductor 2, it should not be construed as limited thereto. It is also possible to provide a plurality of columnar conductors 3 for a single first conductor 2.

The minute space 30 filled with the columnar conductor 3 is a through-hole, a non-through-hole (blind hole), or a via hole. While the minute space 30 has a hole diameter of, for example, 60 μm or less, the thickness of the wafer itself is typically tens of μm. Accordingly, the minute space 30 has a considerably high aspect ratio.

Referring to FIG. 17, the first conductor 2 is formed flat on the surface of the substrate 1, and the second conductor 3 is deposited on the surface of the first conductor 2 with the junction film 4 between. That is, the conductors are arranged two-dimensionally.

Although FIG. 17 shows a substrate of a simple structure, it may actually have a more complicated structure in order to realize appropriate function and structure depending on the type of the electronic device, for example, as shown in FIGS. 1 to 5. The substrate may be a wafer or a chip cut out of the wafer.

For the substrate 1, various materials may be used as long as having a certain heat resistance, including a metal, an alloy, a metal oxide, a ceramic, a glass, a plastic, a composite thereof, and a laminate thereof. The physical properties and structure of the substrate 1 vary depending on the type of the target device. For a semiconductor device, for example, use can be made of Si, SiC, SOI or the like. For a passive electronic circuit device, it may take the form of a dielectric, a magnetic or a composite thereof. Also when realizing a MRAM (magnetoresistive random access memory), a MEMS (micro electro mechanical systems), an optical device, a solar cell, a flat display such as an EL display, a liquid crystal display, or a plasma display, a wafer to be used should have physical properties and structure meeting the requirements. If the substrate 1 is a semiconductor substrate, it is possible to previously form a semiconductor circuit element.

The first conductor 2 is a flat thin film formed on one side of the substrate 1. If the substrate 1 is a silicon wafer and the semiconductor circuit element is formed previously, the first conductor 2 may serve as a lead conductor for the semiconductor circuit element. The first conductor 2 may have various planar patterns depending on required functions. If needed, the area around the first conductor 2 may be filled with an insulating film. The first conductor 2 is made of a known material such as a metal material mainly composed of Cu. If needed, it may contain Zn (zinc), Al (aluminum) or Ti (titanium). The first conductor 2 may be formed by a thin-film formation technology such as CVD or sputtering.

The second conductor 3 is made of a metal material mainly composed of a Sn alloy. Specifically, it may contain Sn and at least one of In, Al and Bi. It may further contain Ga, which is useful as an antioxidizing agent. The illustrated second conductor 3 is a flat thin film deposited on the surface of the first conductor 2 with the junction film 4 between.

The junction film 4 is made of a metal material having a higher melting point than the Sn alloy and disposed at least between the first conductor 2 and the second conductor 3 for joining them together, wherein the metal element is diffused into the second conductor 3 to produce an alloy area AL. The metal element is diffused with such a concentration gradient that its content (diffusion amount) decreases with the distance from the junction film 4, as schematically shown in FIG. 17. In FIG. 17, the alloy area AL is shown as if it is an area defined by the alternate long and short dash line, but this is merely for convenience of description. Actually, there is no definite boundary. For the junction film 4, use can be made of any metal having a higher melting point than the Sn alloy. Specifically, examples include Cu, Ag, Al, Au and Zn.

(Manufacturing Method)

Next will be described a method for manufacturing the above electronic device, particularly, a substrate or interposer to be used for the electronic device.

Figure 18:
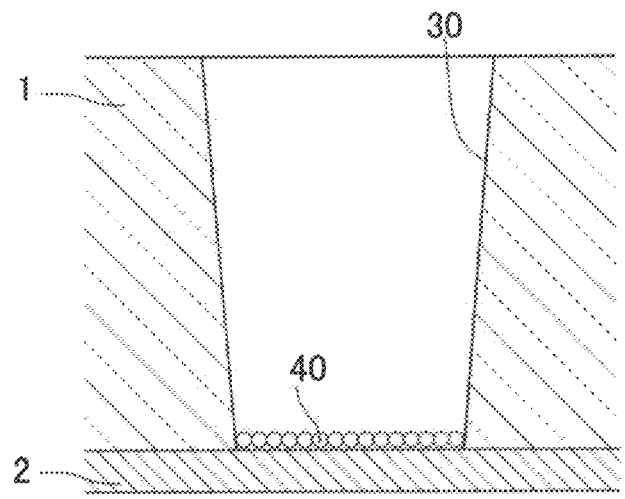
FIG. 18 is a view showing a production process of the electronic device substrate of FIG. 17.

With chemical reaction etching, for example, using an inductively coupled high density plasma apparatus, or laser drilling, at first, the minute space 30 is formed by etching along the thickness direction of the substrate 1, as shown in FIG. 18. The shape of the minute space 30 varies depending on the characteristics of the chemical reaction etching and is not limited to the illustrated one.

Then, metal particles 40 are supplied to the inside of the minute space 30, for example, by means of screen printing. Specific examples of the metal particles 40 are the same as described above. The metal particles 40 may be supplied in such a small quantity as to form only one to three layers of metal particles on the surface of the first conductor 2.

Figure 19:
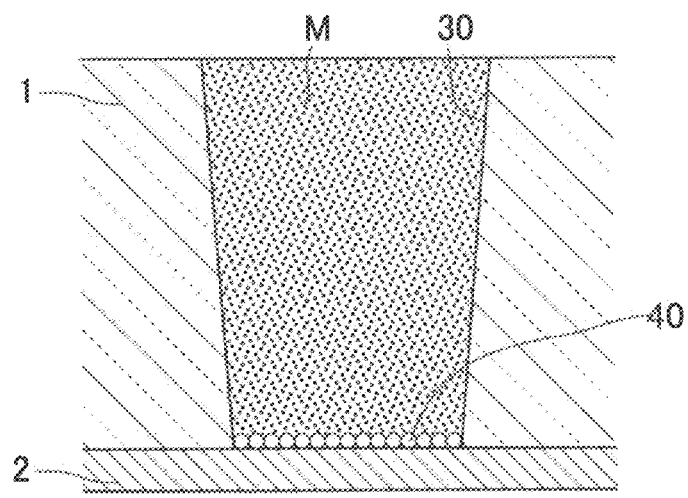
FIG. 19 is a view showing a step after the step of FIG. 18.

Then, the columnar conductor 3 is formed by pouring into the minute space 30 a molten metal M containing the Sn alloy, as shown in FIG. 19. During this molten metal pouring process, the metal particles 40 within the minute space 30 are melted and diffused into the molten metal M containing the Sn alloy. By cooling and hardening, then, the junction film 4 is formed between the first conductor 2 and the columnar conductor 3 for joining them together, wherein the metal element within the junction film 4 is diffused into the columnar conductor 3 to create the alloy area AL (see FIG. 17). For filling, pressurizing and hardening the molten metal M, use can be made of the following apparatuses illustrated in FIGS. 30 to 42.

Figure 20:
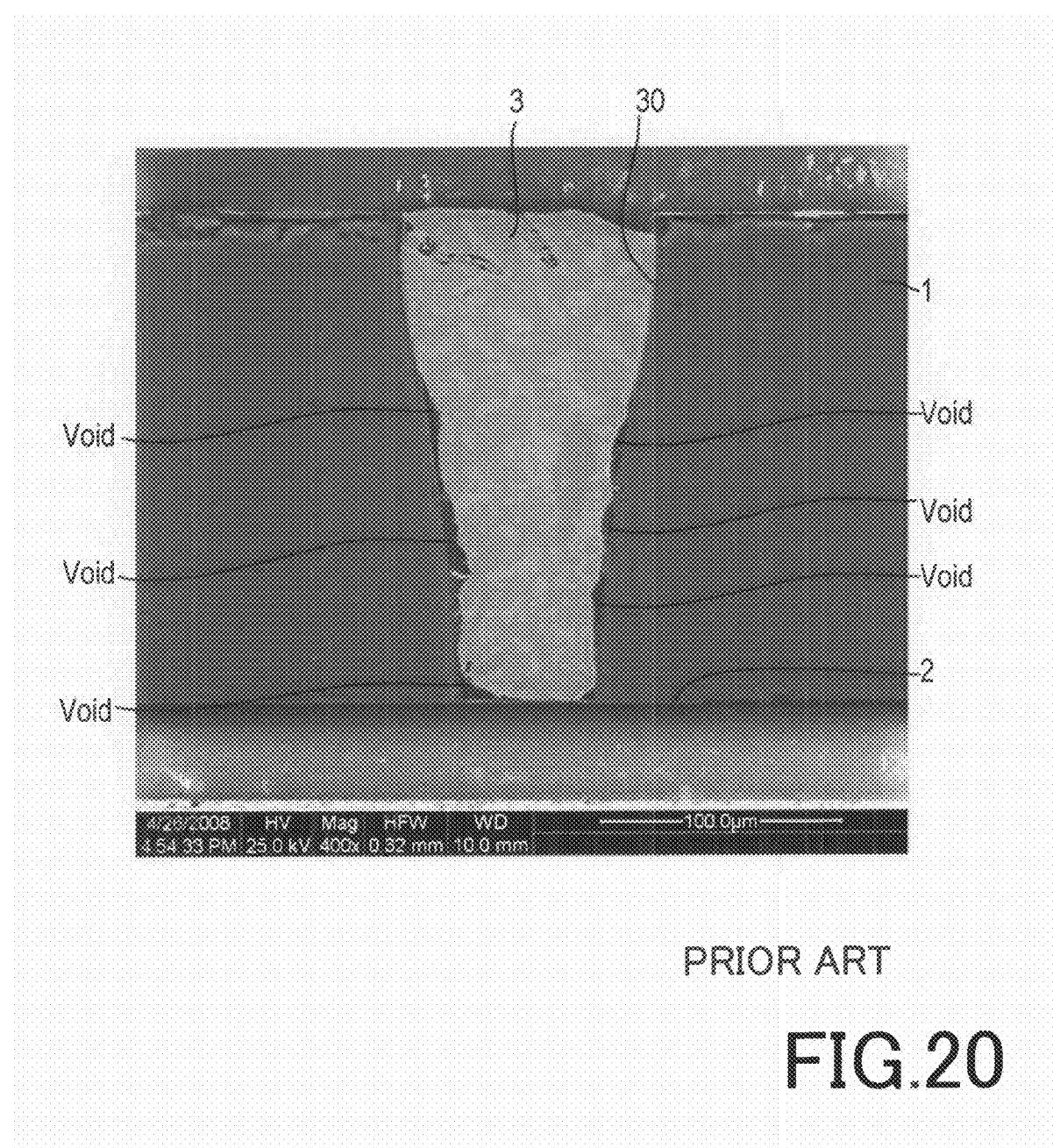
FIG. 20 is a SEM photograph of a conventional substrate being a comparative example.
Figure 21:
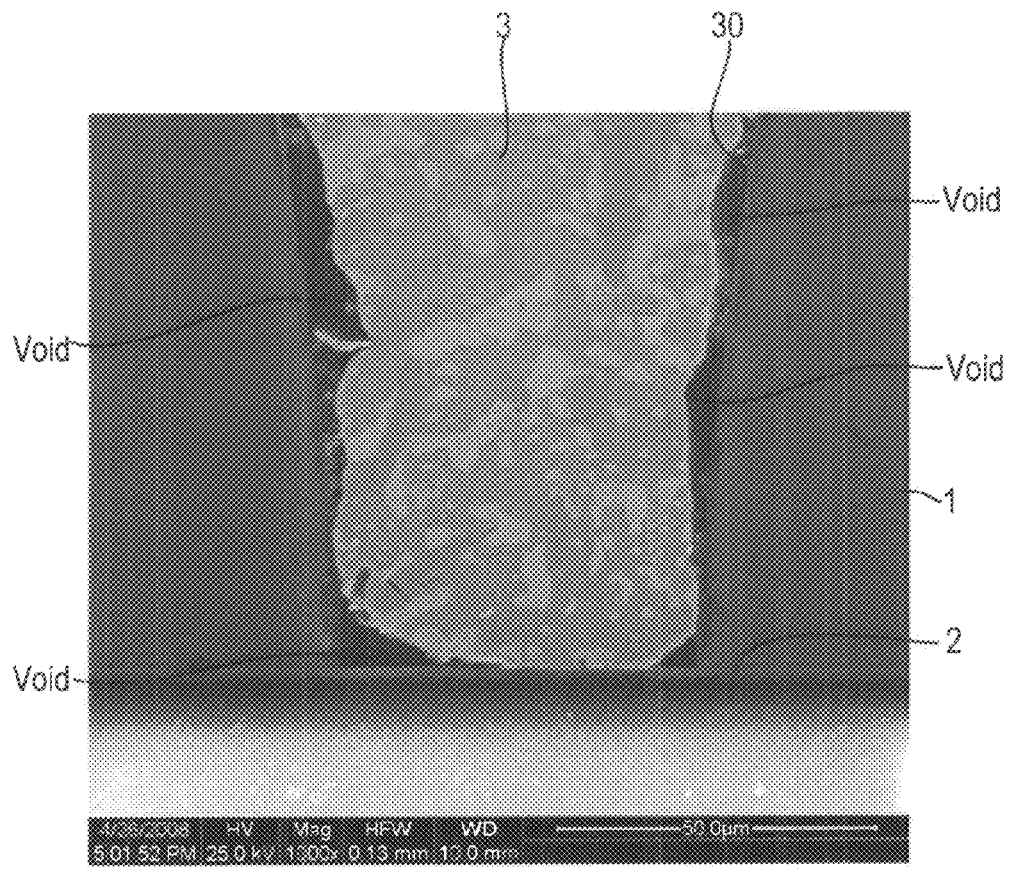
FIG. 21 shows the SEM photograph of FIG. 20 on an enlarged scale.
Figure 22:
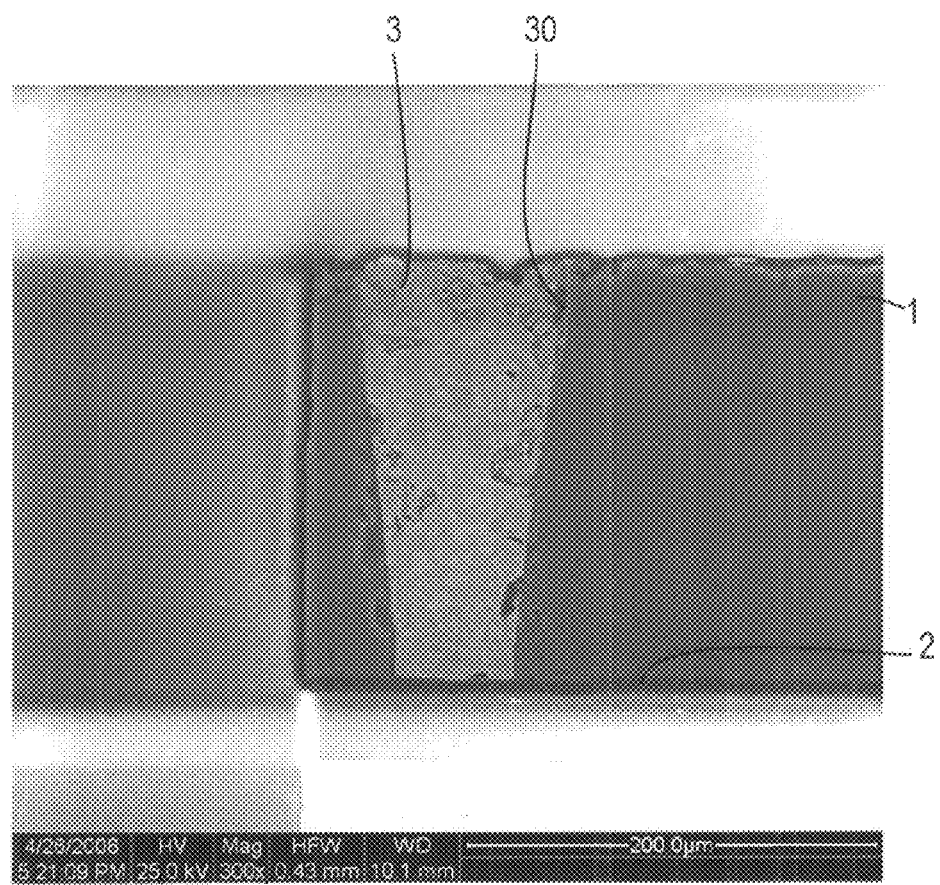
FIG. 22 is a SEM photograph of a substrate to be used for an electronic device according to the present invention.

Next, the effects of the above manufacturing method will be described in detail with reference to the experimental data of FIGS. 20 to 24 and in comparison with a conventional substrate (which may also be referred to as electronic device). FIG. 20 is a SEM photograph of a conventional substrate being a comparative example, and FIG. 21 shows the SEM photograph of FIG. 20 on an enlarged scale. FIG. 22 is a SEM photograph of a substrate according to the present invention, FIG. 23 shows the SEM photograph of FIG. 22 on an enlarged scale, and FIG. 24 shows the SEM photograph of FIG. 22 on a further enlarged scale.

The substrate shown in FIGS. 20 and 21 is constructed such that the first conductor 2 mainly composed of Cu was formed on one side of the silicon substrate 1 and one end of the columnar conductor 3 was directly joined to the first conductor 2. The columnar conductor 3 was formed by filling a molten electrode material mainly composed of a molten Sn alloy into the minute space 30, wherein a flux was used for reducing the oxide film on the surface of the first conductor 2.

As apparent from FIGS. 20 and 21, considerably large voids are formed between the periphery of the columnar conductor 3 and the inner wall surface of the minute space 30. Although the oxide film on the surface of the first conductor 2 can be reduced by applying a flux reduction technology, pouring the flux into the minute space 30 along with the molten metal material generates a flux gas. In electronic devices of this type, the minute space 30 is a minute hole having a hole diameter of, for example, tens of μm or less and also a considerably high aspect ratio. If the flux gas is generated within the thus-shaped minute space 30, of course, the gas cannot easily escape. This creates voids due to the flux gas around the columnar conductor 3, which results in reduction of sectional area of the columnar conductor 3, increase of electrical resistance, and eventually poor connection to the first conductor 2 and increase of junction resistance.

Figure 23:
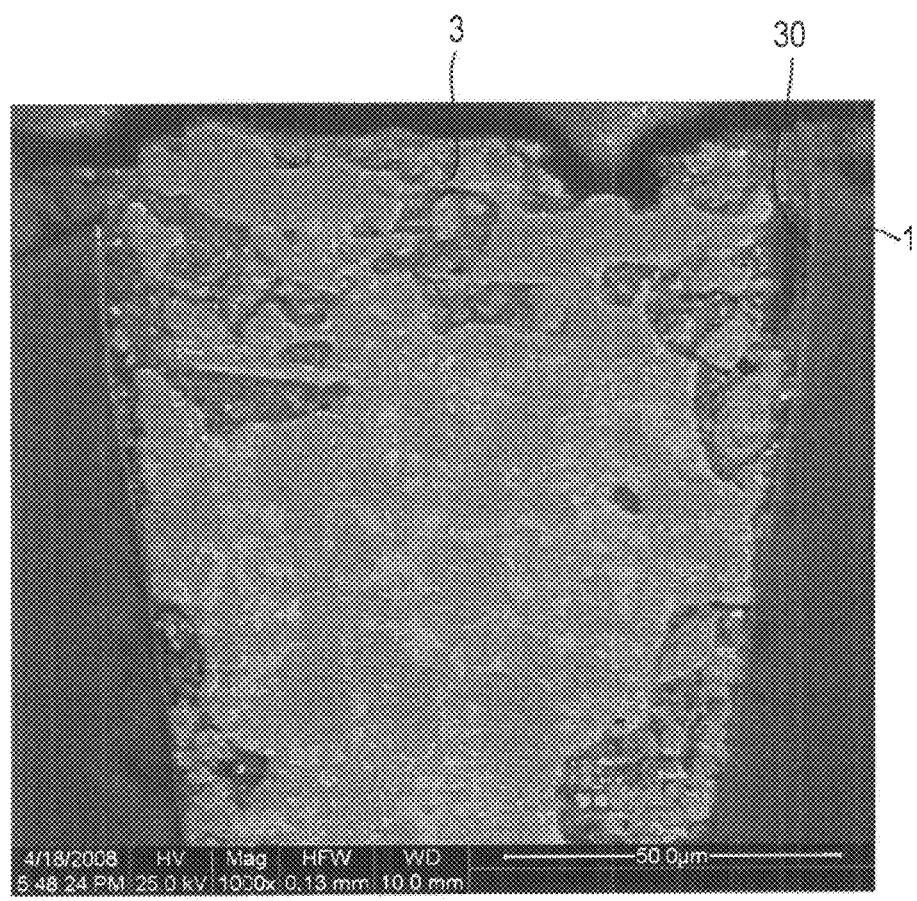
FIG. 23 shows the SEM photograph of FIG. 22 on an enlarged scale.
Figure 24:
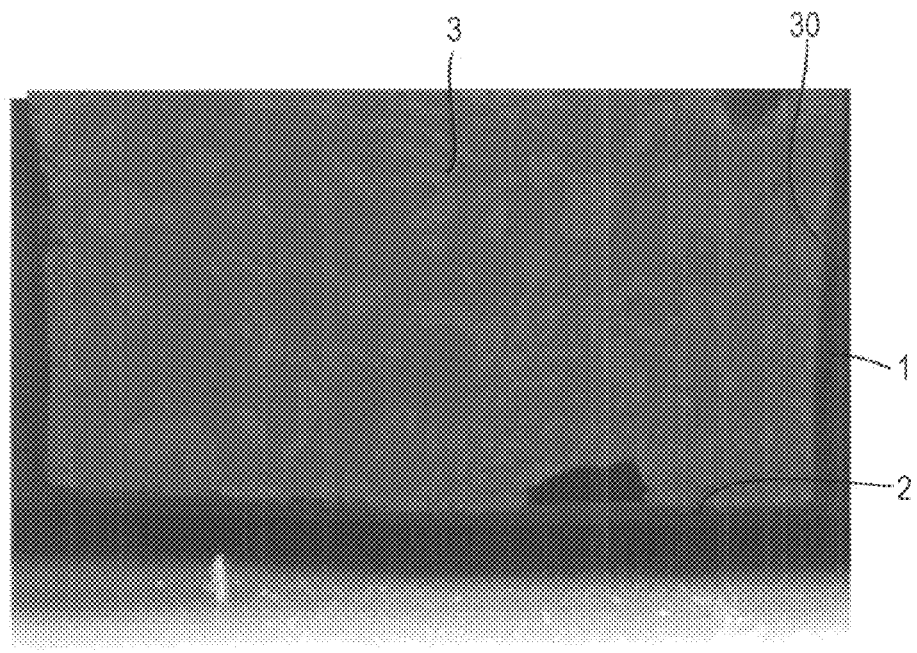
FIG. 24 shows the SEM photograph of FIG. 22 on a further enlarged scale.

In the substrate according to the present invention, on the other hand, the peripheral surface of the columnar conductor 3 is in close contact with the inner wall surface of the minute space 30 formed in the substrate 1, so that there is almost no voids between them, as shown in FIGS. 22 to 24. Although a shadow like a void can be seen at a contact surface between the first conductor 2 and the columnar conductor 3, this is not a void but a break caused by polishing before taking the SEM photograph.

(2) Second Embodiment

Figure 25:
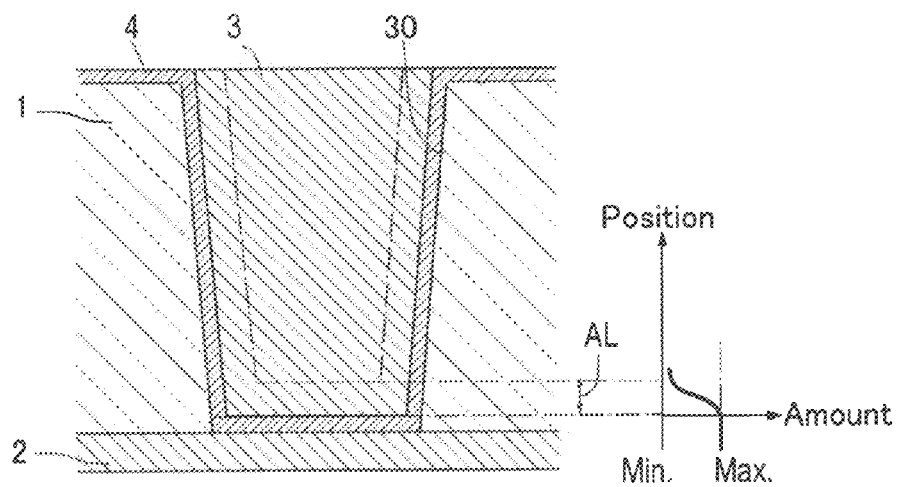
FIG. 25 is a view showing another embodiment of a substrate to be used for an electronic device according to the present invention.

FIG. 25 is a view showing another embodiment of a substrate to be used for an electronic device according to the present invention. The present embodiment is characterized in that the junction film 4 is joined to almost the entire peripheral surface of the columnar conductor 3 within the minute space 30. The junction film 4 may be formed by a thin-film formation technology such as sputtering.

In the embodiment shown in FIG. 25, since the metal element contained in the junction film 4 is diffused into the columnar conductor 3 to create the alloy area AL over the entire peripheral surface of the columnar conductor 3, mutual junction strengths between the first conductor 2, the columnar conductor 3 and the substrate 1 can be further increased in comparison with the embodiment shown in FIG. 17.

Next will be described a method for manufacturing the substrate shown in FIG. 25.

A. Manufacturing Method 1

Figure 26:
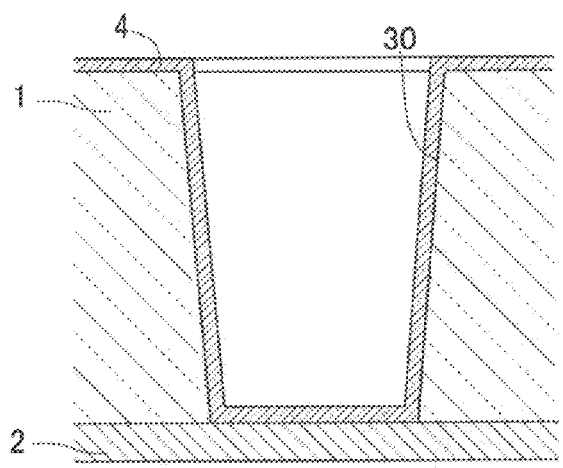
FIG. 26 is a view showing a production process of the electronic device substrate of FIG. 25.

For example, after the minute space 30 is formed by etching along the thickness direction of the substrate 1 with chemical reaction etching, for example, using an inductively coupled high density plasma apparatus, or laser drilling, the junction film 4 is deposited on the inner wall surface of the minute space 30 and the surface of the substrate 1, as shown in FIG. 26. The junction film 4 may be formed by sputtering deposition.

Figure 27:
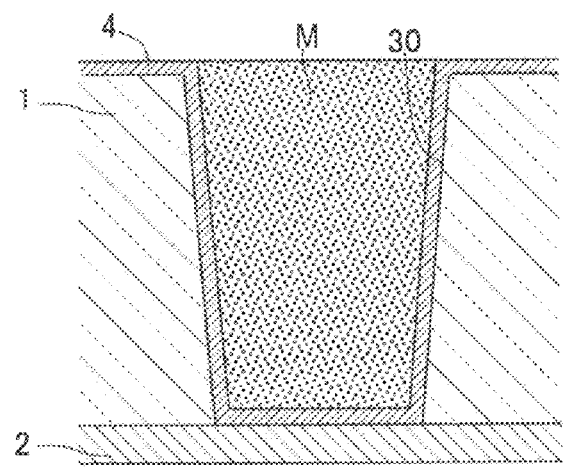
FIG. 27 is a view showing a step after the step of FIG. 26.

Then, as shown in FIG. 27, the molten metal M containing the Sn alloy is supplied to the space surrounded by the junction film 4 deposited on the inner wall surface of the minute space 30. Thereafter, the substrate of FIG. 25 according to the present invention can be obtained by cooling and hardening the molten metal M. For filling, pressurizing and hardening the molten metal M, use can be made of the following apparatuses illustrated in FIGS. 30 to 42.

The process of forming the junction film 4 on the inner wall surface of the minute space 30 of the substrate 1 is also applicable to the case of plating, but in the present invention, as described above, the columnar conductor 3 is formed by pouring into the minute space 30 the molten metal M containing the Sn alloy, instead of plating. As compared with the plating deposition process, the number of processing steps and the processing time can be decreased considerably in the process of supplying the molten metal M. As compared with the case of a plating technology, therefore, the number of processing steps and the processing time can be decreased and shortened considerably. Accordingly, there can be realized a low-cost three-dimensional arrangement substrate.

B. Manufacturing Method 2

Figure 28:
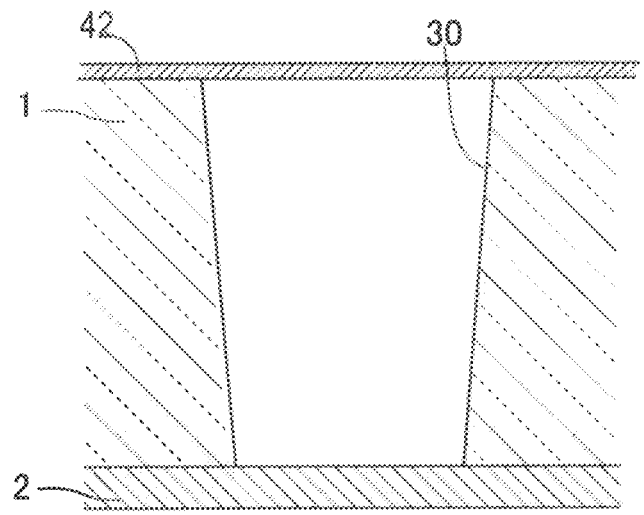
FIG. 28 is a view showing another production process of the electronic device substrate of FIG. 25.
Figure 29:
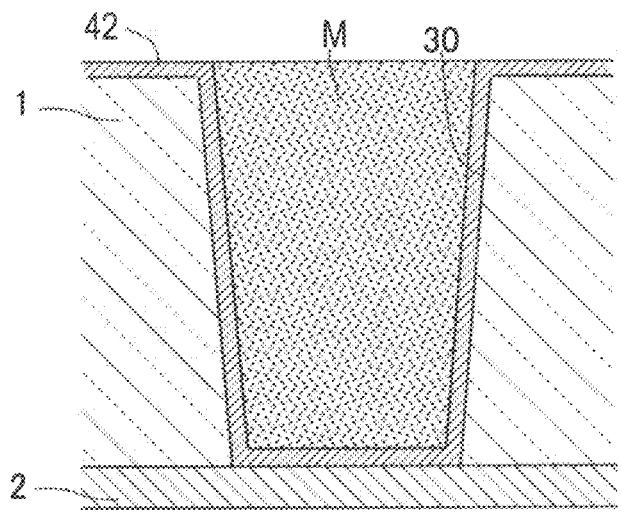
FIG. 29 is a view showing a step after the step of FIG. 28.

The substrate shown in FIG. 25 can also be manufactured by the process shown in FIGS. 28 and 29. At first, after a thin metal sheet 42 is placed on one side of the substrate 1 which has an opening of the minute space 30 formed by chemical reaction etching, for example, using an inductively coupled high density plasma apparatus, or laser drilling, as shown in FIG. 28, the molten metal M is supplied onto the thin metal sheet 42, as shown in FIG. 29. With the molten metal M being supplied, the metal element contained in the thin metal sheet 42 is diffused into the Sn alloy of the molten metal M to create the alloy area. By subsequently cooling and hardening the molten metal M, there is obtained a substrate where the junction film 4 is joined to almost the entire peripheral surface of the columnar conductor 3 within the minute space 30, as shown in FIG. 25. For filling, pressurizing and hardening the molten metal M, use can also be made of the following apparatuses illustrated in FIGS. 30 to 42.

5. Molten Metal Filling Apparatus

In a broad sense, the molten metal filling apparatus according to the present invention refers to the one for filling a molten material into a minute space of a target material and then hardening it. In the production of the electronic device shown in FIGS. 1 to 6, which is the actual application, it is suitable for filling of the columnar conductor 2A. However, it may also be used for filling of the insulating layer 33A.

Figure 30:
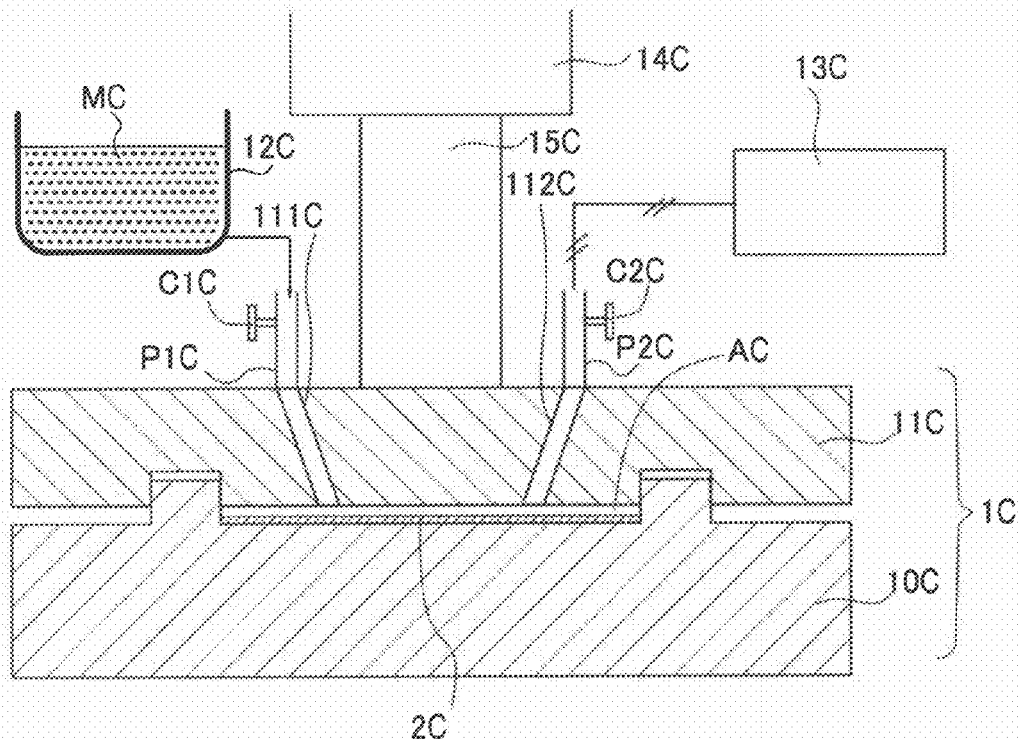
FIG. 30 is a view showing a configuration of a metal filling apparatus (before filling) according to the present invention.

In the embodiment shown in FIG. 30, a target 2C is a thin substrate such as a wafer for an electronic device (semiconductor device), but it can be widely used without limitation and is also applicable to the case where a minute conductor filled structure, a junction structure or a functional portion is formed within another electronic device or micromachine, for example.

For the target 2C, various materials may be used as long as having a resistance to heat emitted from the molten metal, including a metal, an alloy, a metal oxide, a ceramic, a glass, a plastic, a composite thereof, and a laminate thereof. Moreover, the whole shape of the target 2C is not limited to the illustrated flat panel shape but may take any shape.

If a wafer is chosen as the target 2C, its physical properties and structure vary depending on the type of the target device. For a semiconductor device, for example, use can be made of a Si wafer, a SiC wafer, a SOI wafer or the like. For a passive electronic circuit device, it may take the form of a dielectric, a magnetic or a composite thereof. Also when manufacturing a MRAM (magnetoresistive random access memory), a MEMS (micro electro mechanical systems), or an optical device, a wafer to be used should have physical properties and structure meeting the requirements.

The minute space in the wafer is generally called "through-hole", "non-through-hole (blind hole)", or "via hole". The minute space has a hole diameter of, for example, 10 to 60 (μm). The thickness of the wafer itself is typically tens of (μm). Accordingly, the minute space has a considerably high aspect ratio. This is a big reason why a problem occurs when filling the molten metal MC into the minute space.

The metal filling apparatus comprises a support 1C, a molten metal supply unit 12C, and a pressure control unit 13C. The support 1C includes a processing chamber AC for processing a wafer being the target 2C, a first member 10C with a mounting surface for mounting of the wafer, and a second member 11C with a metal supply path 111C leading to the processing chamber AC.

Figure 32:
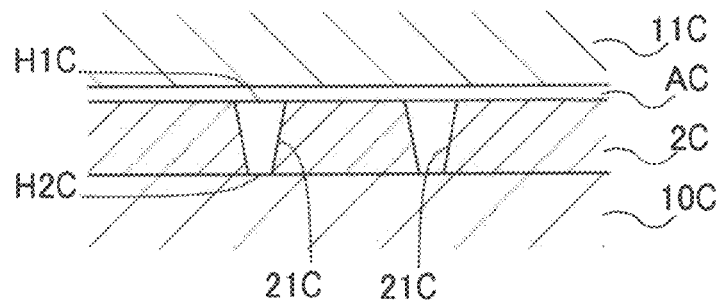
FIG. 32 is an enlarged sectional view of a metal filling apparatus showing a process of filling a metal into a minute space.

With one opening H1C of a minute space 21C being kept open, the first member 10C supports the target 2C from the side opposite from the opening H1C, as shown in FIG. 32. That is, the target 2C is placed on one side of the first member 10C. In the present embodiment, the minute space 21C is a through-hole and an opening H2C on the side opposite from the opening H1C is closed by the first member 10C.

Although the minute spaces 21C have to be exposed, at least at one opening H1C, to the atmosphere of the processing chamber AC, their opening shape, path, number and so on may be determined arbitrarily. They are not required to be a through-hole as in the present embodiment but may be a non-through-hole. They may also have a complicated shape not only extending in the vertical direction as in the drawings but also connecting together in a transverse direction perpendicular thereto. The minute spaces 21C are not limited to intentionally formed ones but also include accidentally generated ones.

On the other hand, the second member 11C is combined with the first member 10C from the side of the exposed openings H1C, defining the processing chamber AC for the target 2C. Here, the combination may be a male-female fit as in the present embodiment or another fit, but it is desirable that the processing chamber AC is formed between the second member 11C and the first member 10C with a higher airtightness.

The molten metal supply unit 12C supplies the molten metal MC to the processing chamber AC. The molten metal supply unit 12C has a melting bath and is connected to the metal supply path 111C of the second member 11C through a delivery pipe P1C. The metal supply path 111C leads to the processing chamber AC. In addition, the delivery pipe P1C is provided with a valve C1C. When supplying the molten metal MC, the valve C1C is opened by mechanical control or manually.

Figure 31:
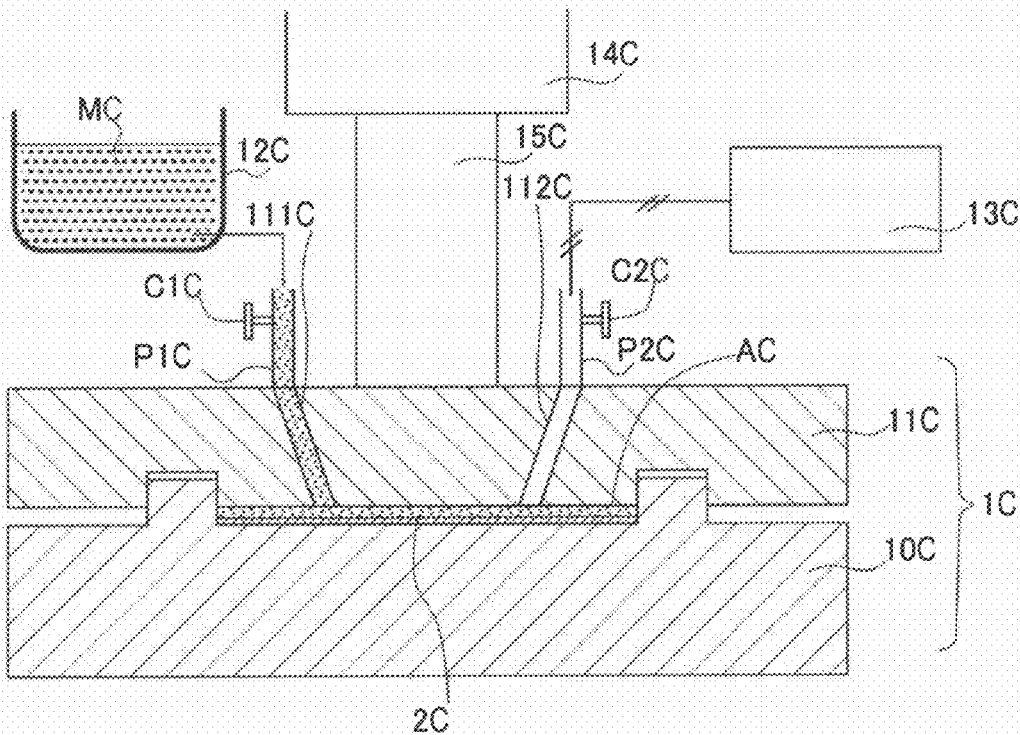
FIG. 31 is a view showing a configuration of a metal filling apparatus (after filling) according to the present invention.

FIG. 31 shows a state where the molten metal is supplied to the processing chamber AC. The molten metal MC is supplied by the molten metal supply unit 12C to fill up the processing chamber AC.

For example, the molten metal supply unit 12C can melt the metal within the range of 200 to 300° C. This melting temperature can be adjusted or reduced by selecting a combination of metal components and nano-sizing them, as will be described below.

If the bottom of the minute space 21C is closed by the conductor, furthermore, it is also effective that noble metal nanoparticles are supplied into the minute space 21C before pouring of the molten metal M and subsequently the process of pouring the molten metal M is carried out. With this process, an oxide film which may possibly be formed on the conductor can be reduced by catalysis of the noble metal nanoparticles, so that a low electrical resistance junction can be formed between the molten metal MC and the conductor.

The noble metal may include gold (Au), silver (Ag), platinum (Pt), palladium (Pd), rhodium (Rh), iridium (Ir), ruthenium (Ru) and osmium (Os). Among these elements, it preferably contains at least one selected from the group consisting of gold (Au), platinum (Pt) and palladium (Pd).

The pressure control unit 13C controls the pressure within the processing chamber AC. When reducing the pressure, the pressure control unit 13C reduces the pressure within the processing chamber AC, for example, to a level as low as a degree of vacuum of $10^{-3}$ (Pa). When increasing the pressure, on the other hand, an inactive gas such as $N^2$ gas is supplied to increase the gas pressure while preventing the oxidization of the molten metal material. The gas pressure within the processing chamber AC may be set, for example, within the range of 0.6 to 1 (kgf/cm$^2$). A suitable dynamic pressure can be generated by controlling the pressure rise/time characteristics before reaching the above gas pressure.

Through a control pipe P2C, the pressure control unit 13C is connected to a pressure transmission path 112C of the second member 11C. The pressure transmission path 112C leads to the processing chamber AC.

In addition, the control pipe P2C is provided with a valve C2C. When increasing or reducing the pressure within the processing chamber AC, the valve C2C is opened by mechanical control or manually.

Before the molten metal supply unit 12C supplies the molten metal MC, the pressure control unit 13C reduces the pressure within the processing chamber AC. This enables the above-mentioned differential pressure filling.

The metal filling apparatus has a pressurizing means 14C for applying a pressure to the processing chamber AC until the molten metal MC is hardened by cooling after the molten metal MC is filled into the minute space 21C. The pressurizing means 14C applies at least one pressing force selected from the group consisting of a gas pressure, a pressing pressure, an injection pressure, and a rolling pressure.

As the above pressurizing means 14C, use can be made of a press for applying the pressing pressure, or the above pressure control unit 13C may double as the pressurizing means for applying the gas pressure. If a roller mechanism is provided on the inner surface side of the second member 11C, alternatively, the rolling pressure can be utilized. Control of pressing time with such a pressurizing means may be performed either manually or mechanically.

When using the pressing pressure, the pressurizing means 14C is connected to the second member 11C through a pressing shaft 15C of the press, and after the minute space 21C is filled with the molten metal MC, the second member 11C is pushed toward the target 2C by applying the pressing pressure to the second member 11C. Thus, the molten metal MC can be sufficiently filled into the minute space 21C down to the bottom thereof.

Next will be described the effects of the metal filling apparatus according to the present invention. FIGS. 32 to 36 are enlarged views of an area about the target 2C in FIG. 30, showing the process of filling the molten metal MC into the minute space 21C.

As shown in FIG. 32, the target 2C is set on the first member 10C, and then the second member 11C is combined with the first member 10C to cover the target 2C. This operation may be performed either manually or mechanically. Thus, the processing chamber AC is formed around the target 2C.

After setting, the valve C2C is opened to let the pressure control unit 13C reduce the pressure within the processing chamber AC. After reducing the pressure, the valve C2C is closed.

Figure 33:
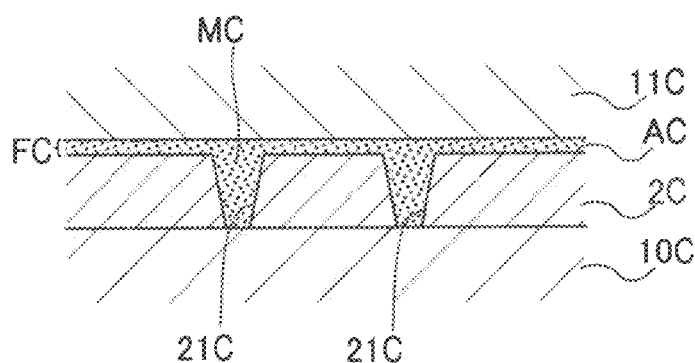
FIG. 33 is an enlarged sectional view of a metal filling apparatus showing a process of filling a metal into a minute space.

Then, as shown in FIG. 33, the molten metal MC is supplied from the molten metal supply unit 12C by opening the valve C1C. At this time, since the pressure within the processing chamber AC is previously reduced, the molten metal MC is filled by the differential pressure. Thus, the molten metal M can also be filled into the minute space 21C through the opening H1C.

At this time, since the processing chamber AC is formed in the shape of a thin sheet on a plane including the openings H1C, the molten metal supply unit can supply the molten metal MC in such a manner as to form a thin metal film FC over the openings H1C.

Figure 34:
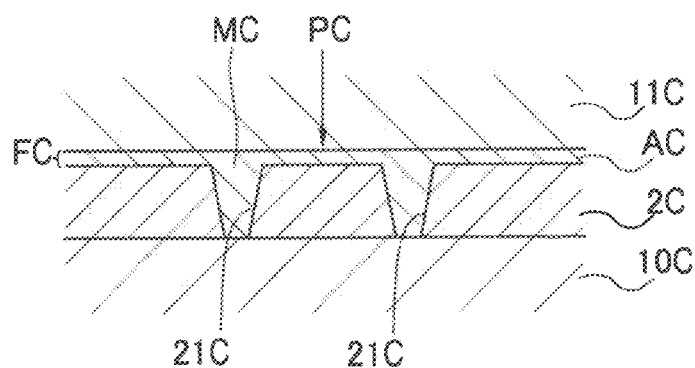
FIG. 34 is an enlarged sectional view of a metal filling apparatus showing a process of filling a metal into a minute space.

Then, as shown in FIG. 34, the filled molten metal MC is cooled and hardened by natural cooling or a forced cooling means such as liquid nitrogen or liquid helium. At this time, the above pressurizing means applies a pressure PC to the molten metal MC until it is hardened. Thus, the molten metal MC can be sufficiently filled into the minute space 21C down to the bottom thereof.

Figure 35:
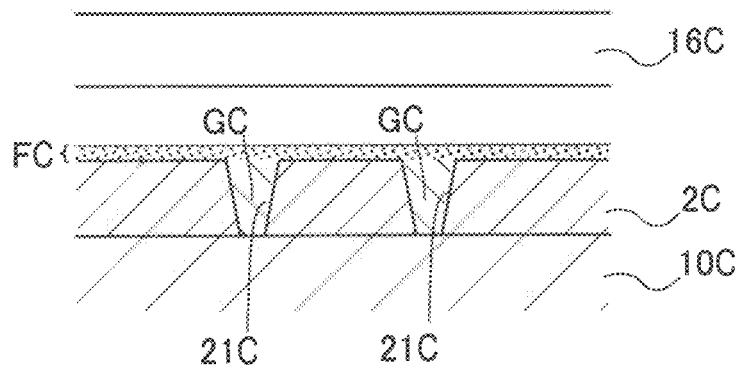
FIG. 35 is an enlarged sectional view of a metal filling apparatus showing a process of filling a metal into a minute space.
Figure 36:
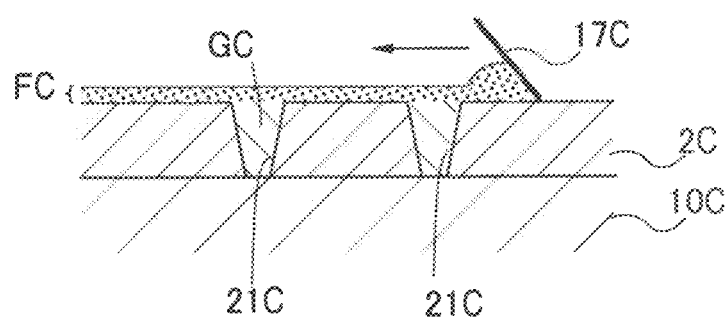
FIG. 36 is an enlarged sectional view of a metal filling apparatus showing a process of filling a metal into a minute space.

Finally, the thin metal film FC is remelted by a heating means 16C such as a heater, as shown in FIG. 35, and the remelted thin metal film FC is wiped off by a metal film removing means such as a squeegee 17C, as shown in FIG. 36. With this subsequent processing, the surface of the target 2C can be flattened.

Moreover, what is needed is such a simple process as wiping off and therefore resupply of the molten metal MC after cooling the molten metal or a CMP process is not required unlike the prior art, which contributes to simplification of the process and improved yield. If necessary, another process of repressurizing and then cooling may be further performed according to the hardening process. However, the subsequent processing is merely for removing the thin metal film FC and flattening one surface of the target 2C and therefore may be omitted if flattening is not necessary.

Although heat for remelting is also conducted to a hardened metal GC hardened within the minute space 21C, since the hardened metal GC has a considerably higher heat capacity than the thin metal film FC, remelting of the thin metal film FC will never lead to remelting of the hardened metal GC. Thus, it is possible to wipe off only the thin metal film FC. Alternatively, the thin metal film FC may be mechanically removed without remelting.

Figure 37:
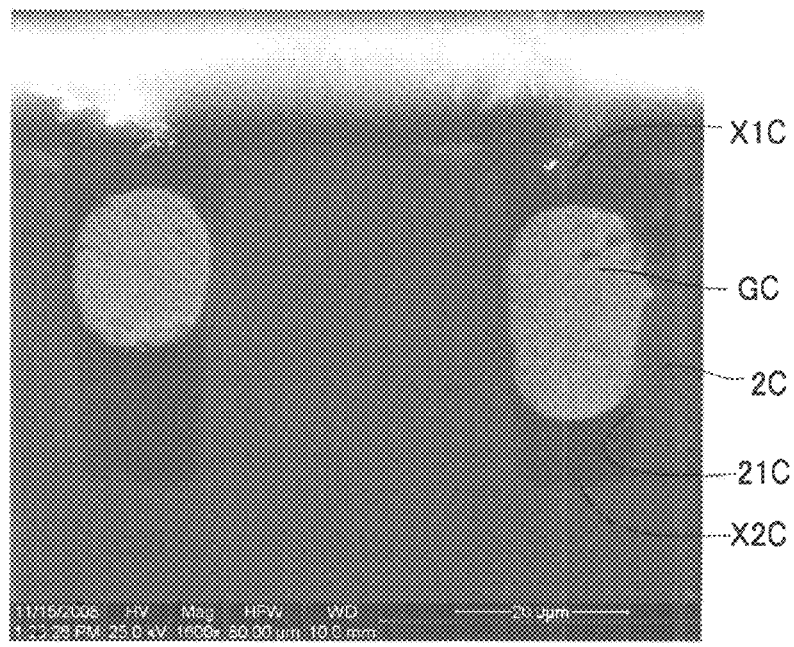
FIG. 37 is a sectional SEM photograph of a semiconductor wafer (silicon wafer) obtained by a metal filling apparatus according to the present invention, wherein pressurized cooling was omitted.

Next, the effects of the present invention will be described with reference to the SEM (scanning electron microscope) photographs. FIG. 37 is a sectional SEM photograph of a semiconductor wafer (silicon wafer) obtained without pressurized cooling, and FIG. 38 is a sectional SEM photograph of a semiconductor wafer (silicon wafer) obtained with pressurized cooling.

Referring first to the SEM photograph of FIG. 37, a recess X1C is formed at the upper end of the hardened metal GC filling the minute space 21C of the target wafer 2C, while a void X2C not filled with the hardened metal GC is also formed at the bottom. Other voids can also be found between the periphery of the hardened metal GC and the inner surface of the minute space 21C.

Figure 38:
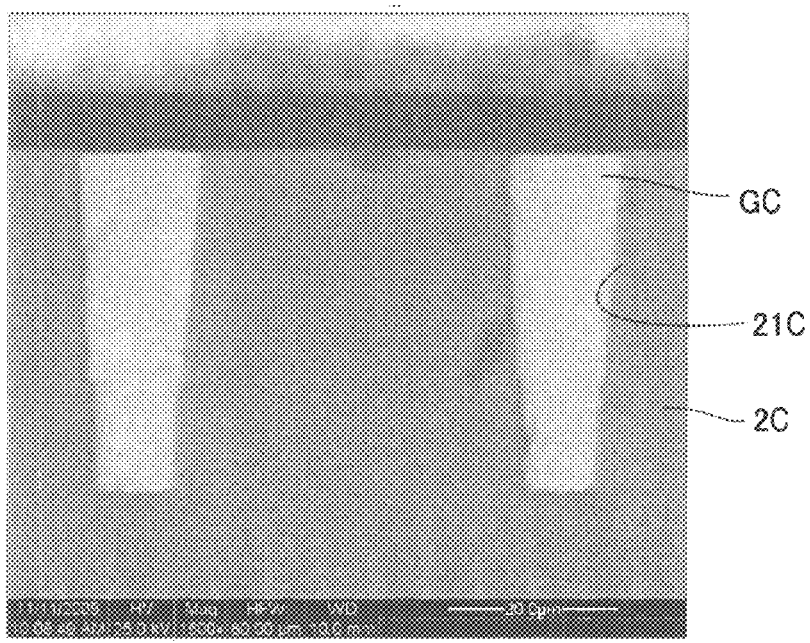
FIG. 38 is a sectional SEM photograph of a semiconductor wafer (silicon wafer) obtained by a metal filling apparatus according to the present invention, wherein pressurized cooling was performed.

Referring to the SEM photograph of FIG. 38, on the other hand, the upper end surface of the hardened metal GC filling the minute space 21C of the wafer 2C is a flat surface continuing to the upper surface of the wafer 2C, and no recess can be found. The lower end surface of the hardened metal GC is in close contact with the bottom of the minute space 21C, and no void can be found at the bottom. Furthermore, the peripheral surface of the hardened metal GC is in close contact with the inner surface of the minute space 21C, and no void can be found.

Here, the conditions with which the results shown in FIGS. 37 and 38 were obtained are shown below.
Pressure within Processing Chamber during Pressure Reduction: $10^{-3}$ (Pa)
Target: 300 (mm)×50 (μm) Silicon Wafer with Glass Protection Film
Dimension of Minute Space:
   Opening Diameter of 15 (μm)
   Bottom Hole Diameter of 10 (μm)
Composition of Molten Metal: Sn, In, Cu, Bi
Melting Temperature of Molten Metal: 250 (° C.)
Pressing Pressure during Pressurized Cooling: 2.0 (kgf/cm$^2$)
Melting Temperature for Remelting: 250 (° C.)
Pressure for Repressurizing: 2.0 (kgf/cm$^2$)

With the metal filling apparatus according to the present invention, as has been described above, the target 2C can be held within the processing chamber AC between the first member 10C and the second member 11C, wherein one opening H1C of the minute space 21C in the target 2C is exposed. Then, after the pressure within the processing chamber AC is reduced by the pressure control unit 13C, the molten metal MC is supplied to the processing chamber AC by the molten metal supply unit 12C, whereby the molten metal MC is filled into the minute space 21C through the exposed opening H1C by the differential pressure.

After filling, since the pressure PC is applied to the processing chamber AC by the pressurizing means until the molten metal MC is hardened by cooling, the molten metal MC within the minute space 21C of the target 2C put in the processing chamber AC is also pressurized during that time.

Thus, the molten metal MC can be sufficiently filled into the minute space 21C down to the bottom thereof and deformation of the metal due to thermal contraction can be suppressed. Accordingly, the minute space 21C can be filled with the metal without creating any cavities or voids.

In the case where the minute space 21C is a through-hole, moreover, since the first member 10C supports the target 2C from the side opposite from the opening H1C of the minute space 21C, which is exposed to the processing chamber AC, the other opening H2C of the target 2C, which is on the side to be supported, can be closed. Therefore, the molten metal MC within the minute space 21C can be sufficiently pushed into the minute space 21C with the pressure PC being applied in one direction from the exposed opening H1C, while the molten metal is prevented from leaking from the other closed opening H2C.

Also in the case where the minute space 21C is a non-through-hole, needless to say, the pressure can be similarly applied in one direction from the opening H1C without causing leakage of the molten metal MC.

Accordingly, the metal filling apparatus according to the present invention can also prevents the molten metal MC from having a recessed surface which would otherwise be caused by cooling in the minute gap 21C. This reliably secures electrical continuity to the outside.

Since the metal is prevented from having a recessed surface, moreover, resupply of a molten metal or a CMP process is not necessary after cooling, which contributes to simplification of the process and improved yield.

In the metal filling apparatus according to the present invention, furthermore, the processing chamber AC for holding the target 2C is created by combining the first member 10C and the second member 11C, while the molten metal supply unit 12C and the pressure control unit 13C are provided separately and independently. Accordingly, the metal filling apparatus according to the present invention does not have the above conventional complicated structure and in addition can save the labor required for the formation and mounting of a metal sheet before filling the metal. With the metal filling apparatus according to the present invention, therefore, cost reduction and improvement of processing efficiency can be achieved.

Figure 39:
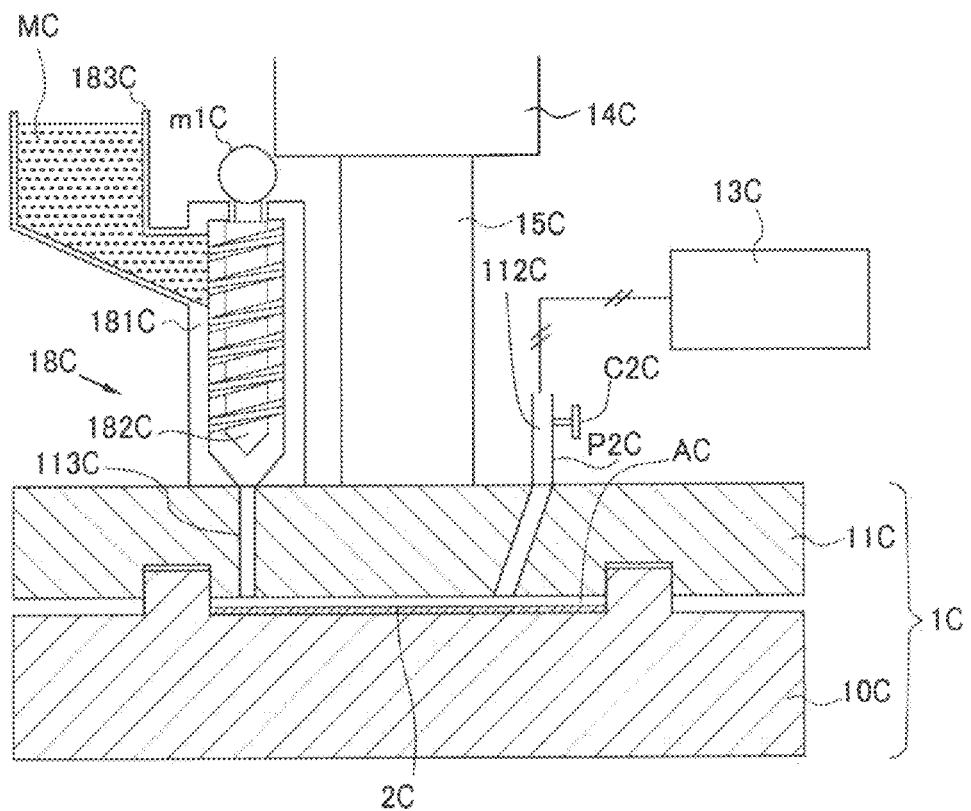
FIG. 39 is a view showing another embodiment of a metal filling apparatus (before filling) according to the present invention.
Figure 40:
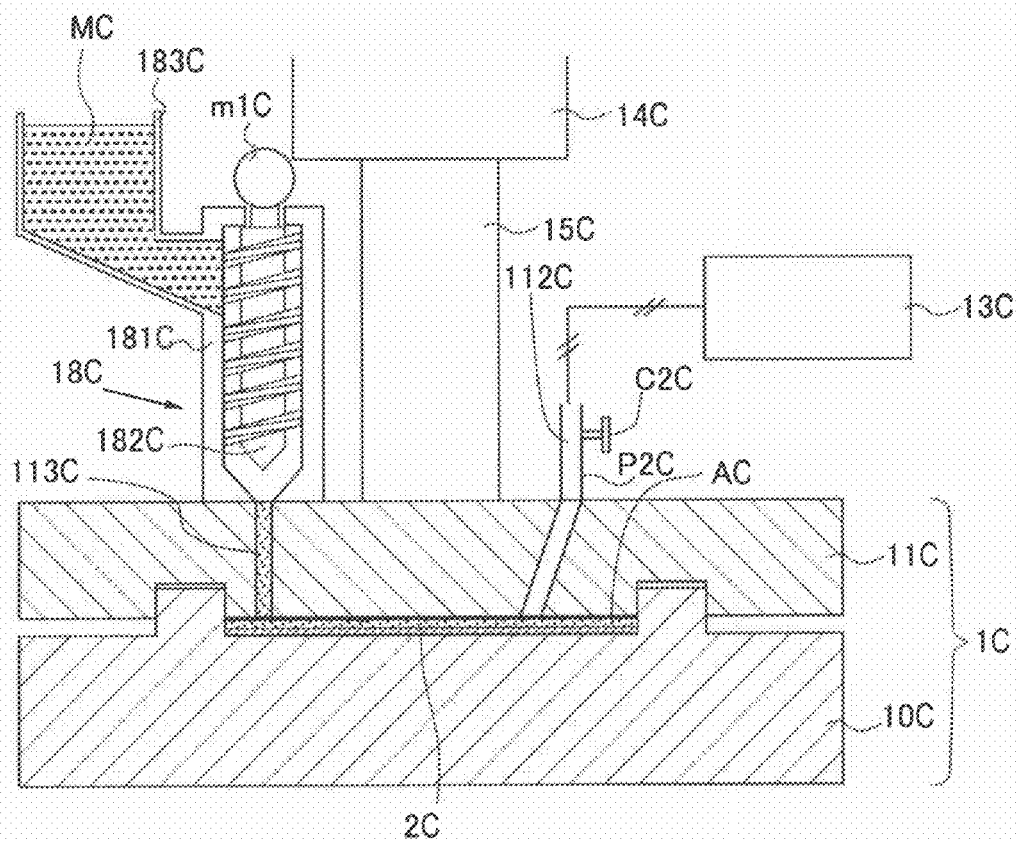
FIG. 40 is a view showing another embodiment of a metal filling apparatus (after filling) according to the present invention.

Next will be described another embodiment with reference to FIGS. 39 and 40. Here, the components common to the foregoing embodiment are indicated by the same reference symbols to avoid explanation.

The difference between the present embodiment and the foregoing embodiment resides in the supply means of the molten metal MC. A molten metal supply unit 18C of the present embodiment is an injection machine using screw extrusion, comprising a generally cylindrical barrel 181C, a screw 182C rotatably mounted within the barrel 181C, a motor m1C connected to the upper end surface of the screw 182C for rotationally driving it, and a hopper 183C for retaining the molten metal MC and supplying it into the barrel 181C.

The barrel 181C is connected at the lower end to the second member 11C, wherein the lower end has an opening enabling communication between a supply path 113C of the second member 11C and the inside of the barrel 181C. Then, the supply path 113C leads to the processing chamber AC.

Moreover, the hopper 183C has a heating means such as a heater for maintaining the molten metal at a uniform temperature. It is also possible to provide a stirring means for stirring the molten metal MC.

When supplying the molten metal MC, the molten metal MC is poured into the barrel 181C by the hopper 183C, and at the same time, the screw 182C is rotationally driven by the motor m1C. Thus, the molten metal MC is extruded from the barrel 181C and supplied to the processing chamber AC through the supply path 113C, as shown in FIG. 40.

Here, the molten metal supply unit 18C may also be provided with the above pressurizing means for applying the injection pressure to the processing chamber until the molten metal MC filled into the minute space 21C is hardened by cooling.

When using such a pressure, including the above-described gas pressure and pressing pressure, not only static pressure but also dynamic pressure can be actively utilized at an early stage of the hardening step to perform dynamic pushing by the dynamic pressure. Thus, the creation of cavities or voids can be avoided more certainly and the filled molten metal MC can be led to the bottom of the minute space 21C more reliably.

Furthermore, the pressurizing by the pressurizing means at the hardening step may be performed either independently of or continuously with the pressurizing at the molten metal supplying step. If performed continuously, the two pressurizing processes can be integrated into a single pressurizing process. This can be typically seen in the case where the gas pressure is applied with the pressure control unit 13C and the case where the injection pressure is applied with the molten metal supply unit 18C. However, regardless of the integration into a single pressurizing process, it is desirable to adjust the applied pressure.

Figure 41:
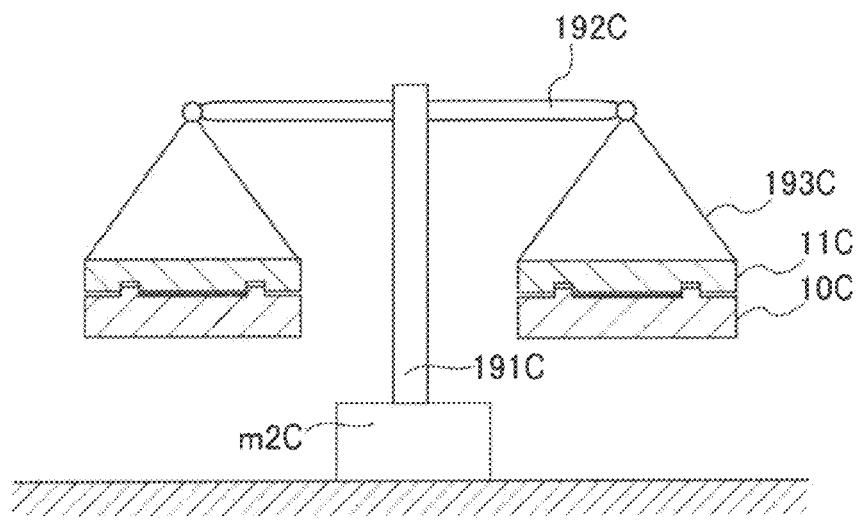
FIG. 41 is a view showing an embodiment in which a metal filling apparatus is provided with an external force generating means (before generating an external force)
Figure 42:
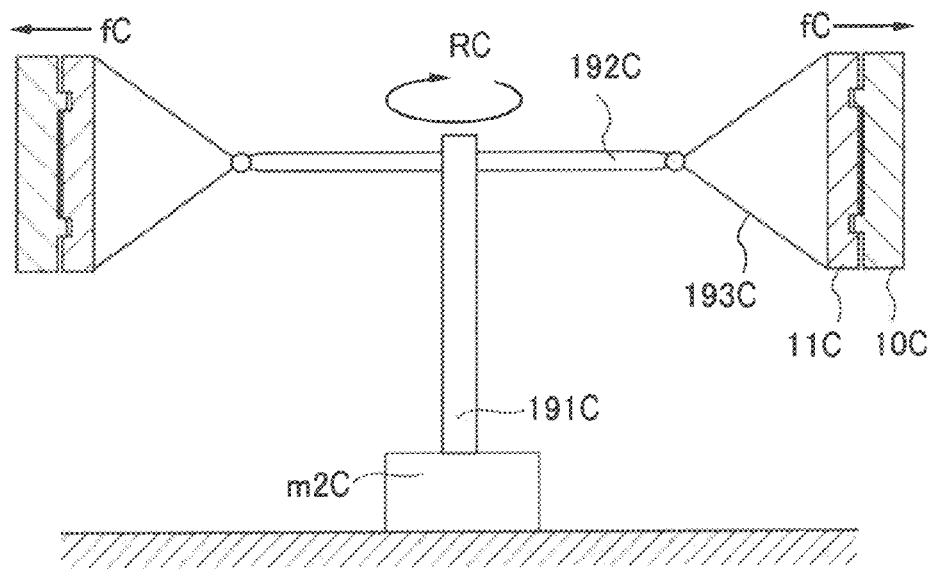
FIG. 42 is a view showing an embodiment in which a metal filling apparatus is provided with an external force generating means (after generating an external force).

In addition to such pressurizing, it is also possible to apply at least one external force selected from a magnetic force and a centrifugal force. FIGS. 41 and 42 show an embodiment in which the apparatus is provided with an external force generating means for a centrifugal force. Here, the portions that have been already described above are omitted from the drawings, except the first member 10C and the second member 11C.

The external force generating means includes a vertically standing rotary shaft 191C connected to and rotationally driven by a motor m2C, an arm shaft 192C horizontally attached to the upper end of the rotary shaft 191C, and wires 193C for suspending the first and second two members 10C, 11C from each of the two ends of the arm shaft 192C.

At the hardening step, the rotary shaft 191C and the arm shaft 192C are rotated in a RC direction by rotation of the motor m2C. At this time, the first and second two members 10C, 11C are subjected to a centrifugal force fC and pulled outwardly from the center of the rotation, as shown in FIG. 42. Thus, the molten metal MC within the minute space 21C is also subjected to the centrifugal force fC. With the pressure thus applied by the centrifugal force fC, the molten metal MC can be filled more reliably into the minute space 21C down to the bottom thereof.

When applying such an external force, preferably, not only static pressure but also dynamic pressure is actively utilized at an early stage of the hardening step to perform dynamic pushing by the dynamic pressure. With this method, the creation of unfilled areas at the bottom can be avoided more reliably by making the molten metal MC certainly reach the bottom of the minute space 21C.

In the present embodiment, the centrifugal force is adopted as an external force, but if a magnetic force is adopted, for example, a magnet may be embedded in the first member 10C to draw the molten metal MC into the minute space 21C using its magnetic force.

The present invention has been described in detail above with reference to preferred embodiments. However, obviously those skilled in the art could easily devise various modifications of the invention based on the technical concepts underlying the invention and teachings disclosed herein.

What is claimed is:

1. An electronic device comprising:
a plurality of stacked substrates, wherein
each of said substrates includes a columnar conductor and a ring-shaped insulator,
said columnar conductor extends along a thickness direction of said substrate,
said ring-shaped insulator includes an inorganic insulating layer containing a glass and nm-sized ceramic particles, and
said inorganic insulating layer fills a ring-shaped groove that is provided in said substrate to surround said columnar conductor.

2. The electronic device of claim 1, wherein said ring-shaped insulator has insulating films on inner wall surfaces of said ring-shaped groove.

3. The electronic device of claim 2, wherein said insulating film is an oxide film or a nitride film.

4. The electronic device of claim 1, wherein said substrate has a semiconductor device.

5. The electronic device of claim 4, wherein said electronic device is a three-dimensional system-in-package (3D-SiP).

6. The electronic device of claim 5, wherein said electronic device is one of a system LSI, a memory LSI, an image sensor, and a MEMS.

7. The electronic device of claim 1, wherein between adjacent ones of said plurality of substrates, connection conductors are joined to each other through a junction film, and
said junction film contains a first metal or alloy component and a second metal or alloy component having a higher melting point than said first metal or alloy component, whereby a melting temperature is made higher than the melting point of said first metal or alloy component.

8. The electronic device of claim 7, wherein each of said plurality of substrates includes a columnar conductor and a connection conductor, and
between adjacent ones of said plurality of substrates, the columnar conductor of one substrate is joined to said connection conductor of the other substrate through said junction film.

9. The electronic device of claim 7, wherein said junction film is joined such that said second metal or alloy component is used as a core and said first metal or alloy component is applied around said second metal or alloy component.

10. The electronic device of claim 7, wherein said first metal or alloy component contains at least one selected from the group consisting of Sn, In, Bi, Ga and Sb.

11. The electronic device of claim 7, wherein said second metal or alloy component contains at least one selected from the group consisting of Cr, Ag, Cu, Au, Pt, Pd, Ni, a Ni—P alloy and a Ni—B alloy.

12. The electronic device of claim 7, wherein said columnar conductor contains at least one selected from the group consisting of Ga, Sb, Ag, Cu and Ge and at least one selected from the group consisting of Sn, In and Bi.

13. The electronic device of claim 7, wherein a noble metal film is disposed between said junction film and said connection conductor.

14. The electronic device of claim 13, wherein said noble metal film contains at least one selected from the group consisting of Ag, Au, Pd and Pt.

15. A method for manufacturing an electronic device of claim 7, comprising the steps of:
   between connection conductors of adjacent substrates, applying a junction material containing said first metal or alloy component and said second metal or alloy component having a higher melting point than said first metal or alloy component; and
   then melting said junction material by a heat treatment.

16. The electronic device of claim 1, wherein said columnar conductor is a metal or alloy melt-solidified product, has an equiaxed crystal area at least in an area opposed to said substrate, and contains bismuth (Bi) and gallium (Ga) as an inoculant within said melt-solidified product.

17. The electronic device of claim 16, wherein said conductor contains indium (In).

18. The electronic device of claim 1, wherein each of said substrates includes a first conductor and a junction film,
   said first conductor is opposed to a bottom face of said columnar conductor,
   said columnar conductor fills a through-hole of said substrate with the bottom face opposed to said first conductor at a bottom of said through-hole,
   said junction film is disposed between said bottom face of said columnar conductor and said first conductor inside the bottom of said through-hole to join said first conductor to said columnar conductor.

19. The electronic device of claim 18, wherein said junction film is disposed adjacent to a periphery of said columnar conductor.

20. A method for manufacturing an electronic device of claim 18, comprising the steps of:
   on said first conductor formed on said substrate, forming a junction film of a metal material having a higher melting point than a Sn alloy;
   on said junction film, then supplying a molten Sn alloy for forming the columnar conductor; and
   letting the metal material of said junction film thermally diffuse into said molten Sn alloy at a temperature lower than said melting point, whereby after hardening, said molten Sn alloy has an increased melting point.

21. A substrate comprising:
   a columnar conductor; and
   a ring-shaped insulator, wherein
   said columnar conductor extends along a thickness direction of said substrate,
   said ring-shaped insulator includes an inorganic insulating layer containing a glass and nm-sized ceramic particles, and
   said inorganic insulating layer fills a ring-shaped groove that is provided in said substrate to surround said columnar conductor.

22. The substrate of claim 21, wherein said ring-shaped insulator has insulating films on inner wall surfaces of said ring-shaped groove.

23. The substrate of claim 21, wherein said insulating film is an oxide film or a nitride film.

* * * * *